US012250866B2

(12) United States Patent
Song et al.

(10) Patent No.: US 12,250,866 B2
(45) Date of Patent: Mar. 11, 2025

(54) DISPLAY MOTHERBOARD AND METHOD FOR MANUFACTURING DISPLAY SUBSTRATE

(71) Applicants: Chengdu BOE Optoelectronics Technology Co., Ltd., Sichuan (CN); BOE Technology Group Co., Ltd., Beijing (CN)

(72) Inventors: Yongjie Song, Beijing (CN); Siyu Wang, Beijing (CN); Shun Zhang, Beijing (CN); Yi Zhang, Beijing (CN); Fengli Ji, Beijing (CN); Yuanqi Zhang, Beijing (CN); Yi Qu, Beijing (CN); Yan Huang, Beijing (CN)

(73) Assignees: CHENGDU BOE OPTOELECTRONICS TECHNOLOGY CO., LTD., Sichuan (CN); BOE TECHNOLOGY GROUP CO., LTD., Beijing (CN)

(*) Notice: Subject to any disclaimer, the term of this patent is extended or adjusted under 35 U.S.C. 154(b) by 520 days.

(21) Appl. No.: 17/631,136

(22) PCT Filed: Apr. 9, 2021

(86) PCT No.: PCT/CN2021/086097
§ 371 (c)(1),
(2) Date: Jan. 28, 2022

(87) PCT Pub. No.: WO2021/238429
PCT Pub. Date: Dec. 2, 2021

(65) Prior Publication Data
US 2022/0262889 A1 Aug. 18, 2022

(30) Foreign Application Priority Data
May 27, 2020 (CN) .......................... 202010465150.5

(51) Int. Cl.
*H10K 59/88* (2023.01)
*H01L 27/12* (2006.01)
(Continued)

(52) U.S. Cl.
CPC ........... *H10K 59/88* (2023.02); *H01L 27/124* (2013.01); *H10K 59/1201* (2023.02);
(Continued)

(58) Field of Classification Search
CPC ........... H10K 59/131; H10K 59/80515; H10K 59/88; H10K 59/1201; H10K 59/00; H01L 27/12
See application file for complete search history.

(56) References Cited

U.S. PATENT DOCUMENTS

| 10,510,822 B2 | 12/2019 | Kim et al. |
| 2021/0057460 A1* | 2/2021 | Park ....................... H10K 59/88 |

FOREIGN PATENT DOCUMENTS

| CN | 107799577 A | 3/2018 |
| CN | 110993670 A | 4/2020 |

(Continued)

*Primary Examiner* — Ratisha Mehta
*Assistant Examiner* — Brad A Knudson
(74) *Attorney, Agent, or Firm* — Nath, Goldberg & Meyer; Joshua B. Goldberg

(57) ABSTRACT

A display motherboard and a manufacturing method of a display substrate are provided. The display motherboard includes: a substrate including a valid area and an edge area, the valid area including a plurality of panel areas and a to-be-cut area, and the panel area including a display area and a frame area; multiple first power lines in each display area and the edge area and extending along a first direction; multiple first display electrodes in each display area and multiple virtual electrodes in the edge area, the first display electrodes and the virtual electrodes being in the same layer; wherein an orthographic projection of each first display
(Continued)

electrode on the substrate overlaps an orthographic projection of at most one first power line on the substrate, and an orthographic projection of each virtual electrode on the substrate overlaps orthographic projections of at least two first power lines on the substrate.

20 Claims, 14 Drawing Sheets

(51) Int. Cl.
  *H10K 59/12* (2023.01)
  *H10K 59/121* (2023.01)
  *H10K 59/122* (2023.01)
  *H10K 59/131* (2023.01)
  *H10K 59/80* (2023.01)
  *H10K 71/00* (2023.01)
(52) U.S. Cl.
  CPC ..... *H10K 59/131* (2023.02); *H10K 59/80515* (2023.02); *H10K 59/1213* (2023.02); *H10K 59/122* (2023.02); *H10K 71/00* (2023.02)

(56) References Cited

FOREIGN PATENT DOCUMENTS

| | | | |
|---|---|---|---|
| CN | 111584757 A | | 8/2020 |
| JP | 2001166701 A | * | 6/2001 |

* cited by examiner providing a substrate, the substrate including a valid area and an edge area on at least one side of the valid area, the valid area including a plurality of panel areas and an to-be-cut area that separates the plurality of panel areas from each other and separates the edge area from a panel area adjacent thereto, the panel area including a display area and a frame area surrounding the display area

↓ forming a plurality of first power lines in each display area and the edge area of the substrate, the first power line extending along a first direction

↓ forming a plurality of first display electrodes in each display area, and simultaneously forming a plurality of virtual electrodes in the edge area; an orthographic projection of each of the plurality of first display electrodes on the substrate overlapping the orthographic projection of at most one first power line on the substrate, and an orthographic projection of each of the plurality of virtual electrodes on the substrate overlapping the orthographic projections of at least two first power lines on the substrate

↓ cutting the substrate formed with the first power lines, the first display electrodes and the virtual electrodes along the to-be-cut area to obtain a plurality of display substrates

Fig. 14

DISPLAY MOTHERBOARD AND METHOD FOR MANUFACTURING DISPLAY SUBSTRATE

CROSS REFERENCE TO RELATED APPLICATION

This is a National Phase Application filed under 35 U.S.C. 371 as a national stage of PCT/CN2021/086097, filed on Apr. 9, 2021, an application claims priority to Chinese patent application No. 202010465150.5, filed on May 27, 2020, the contents of which are incorporated herein by reference in their entirety.

TECHNICAL FIELD

The present disclosure relates to the field of display technology, and particularly relates to a display motherboard and a method for manufacturing a display substrate.

BACKGROUND

The AMOLED (Active-matrix organic light emitting diode) screens have become the mainstream technology in the display field due to their characteristics such as light weight, thinness, high contrast, wide color gamut, and the like. In manufacturing processes of some AMOLED display substrates, structures of virtual pixels, such as virtual pixel circuits and virtual anodes, are disposed outside a valid display area.

SUMMARY

Embodiments of the present disclosure provide a display motherboard, including:
  a substrate, the substrate including a valid area and an edge area on at least one side of the valid area, the valid area including a plurality of panel areas and a to-be-cut area, the to-be-cut area separating the plurality of panel areas from each other and separating the edge area from a panel area adjacent to the edge area, and the panel area including a display area and a frame area surrounding the display area;
  a plurality of first power lines on the substrate, each display area and the edge area being provided with a plurality of the first power lines, and the first power line extending along a first direction;
  a plurality of first display electrodes in each display area and a plurality of virtual electrodes in the edge area, the plurality of first display electrodes and the plurality of virtual electrodes being in the same layer;
  wherein an orthographic projection of each of the plurality of first display electrodes on the substrate overlaps an orthographic projection of at most one first power line, and an orthographic projection of each of the plurality of virtual electrodes on the substrate overlaps orthographic projections of at least two first power lines on the substrate.

In some embodiments, the orthographic projection of each of the plurality of virtual electrodes on the substrate overlaps orthographic projections of 3 to 40 first power lines on the substrate.

In some embodiments, the orthographic projection of the virtual electrode on the substrate is of a rectangular shape In some embodiments, there is an interval between any two virtual electrodes, and an interval between two adjacent virtual electrodes has a width between 5 µm and 15 µm.

In some embodiments, an interval area between at least two adjacent virtual electrodes is a strip area extending along the first direction, and an orthographic projection of the strip area on the substrate does not overlap an orthographic projection of any one first power line on the substrate.

In some embodiments, the display motherboard further includes a pixel defining layer, the pixel defining layer including:
  a first pixel defining portion in the display area and on a side of the plurality of first display electrodes away from the substrate, the first pixel defining portion having a plurality of pixel openings in one-to-one correspondence with the plurality of first display electrodes, and each of the plurality of pixel openings exposing at least a part of the corresponding first display electrode; and
  a second pixel defining portion in the edge area and on a side of the plurality of virtual electrodes away from the substrate, the second pixel defining portion covering each of the plurality of virtual electrodes.

In some embodiments, the display motherboard further includes:
  a plurality of light emitting layers in the plurality of pixel openings in one-to-one correspondence; and
  a second electrode layer in the display area and on a side of the plurality of light emitting layers away from the substrate.

In some embodiments, the display motherboard further includes:
  a spacer layer including first spacers in the display area and second spacers in the edge area, the first spacers being on a side of the first pixel defining portion away from the substrate, and the second spacers being on a side of the second pixel defining portion away from the substrate.

In some embodiments, an orthographic projection of each of the first spacers on the substrate overlaps an orthographic projection of one first power line on the substrate, and an orthographic projection of each of the second spacers on the substrate overlaps an orthographic projection of one second power line on the substrate.

In some embodiments, the first spacers in the display area are arranged in a plurality of rows, and an orthographic projection of the first display electrode on the substrate overlaps an orthographic projection of at most one of the first spacers on the substrate; and
  the second spacers in the edge area are arranged in a plurality of rows, and an orthographic projection of the virtual electrode on the substrate overlaps orthographic projections of two of the second spacers respectively in two rows on the substrate.

In some embodiments, the display motherboard further includes a plurality of display pixel circuits in the display area and electrically coupled to the first display electrodes in one-to-one correspondence, and
  the first display electrode includes a main body portion and a connection portion, the connection portion is electrically coupled to the display pixel circuit, and an orthographical projection of the main body portion on the substrate is of a pentagonal shape or a hexagonal shape.

In some embodiments, an orthographic projection of each first display electrode on the substrate overlaps orthographic projections of at most two display pixel circuits on the substrate.

In some embodiments, the display pixel circuit includes a display light emitting control transistor, and the display motherboard further includes:
 a first planarization layer in both the display area and the edge area and on a side of the display light emitting control transistor away from the substrate;
 a second planarization layer in both the display area and the edge area and on a side of the first planarization layer away from the substrate; and
 display connectors coupled to the plurality of first display electrodes in one-to-one correspondence and between the first planarization layer and the second planarization layer, the main body portion of the first display electrode being on a surface of the second planarization layer away from the substrate, the connection portion of the first display electrode being coupled to the corresponding display connector through a via hole in the second planarization layer, and the display connector being coupled to a drain of the display light emitting control transistor through a via hole in the first planarization layer;
 wherein the virtual electrodes are on the surface of the second planarization layer away from the substrate.

In some embodiments, the display motherboard further includes:
 a plurality of virtual pixel circuits in the edge area and between the substrate and the first planarization layer, an orthographic projection of the virtual electrode on the substrate covering orthographic projections of at least two of the plurality of virtual pixel circuits on the substrate.

In some embodiments, each of the plurality of virtual pixel circuits includes a plurality of virtual transistors including a virtual reset transistor, each virtual transistor including an active layer, and
 the virtual electrode includes a first boundary extending along the first direction, and an orthographic projection of the first boundary on the substrate overlaps orthographic projections of active layers of virtual reset transistors in at least two virtual pixel circuits on the substrate.

In some embodiments, the virtual electrode further includes a second boundary adjacent to the first boundary, an extending direction of the second boundary intersects with an extending direction of the first boundary, and an orthographic projection of the second boundary on the substrate does not overlap an orthographic projection of any one virtual transistor on the substrate.

In some embodiments, each of the plurality of virtual pixel circuits includes a virtual light emitting control transistor, and the display motherboard further includes:
 a plurality of virtual connectors in the edge area and between the plurality of virtual pixel circuits and the plurality of virtual electrodes, the plurality of virtual connectors being disposed on a surface of the first planarization layer away from the substrate.

In some embodiments, the display motherboard further includes:
 a first gate insulating layer between an active layer and a gate of the virtual light emitting control transistor, the gate of the virtual light emitting control transistor being on a side of the active layer away from the substrate;
 a second gate insulating layer on a side of the gate of the virtual light emitting control transistor away from the substrate; and
 an interlayer dielectric layer on a side of the second gate insulating layer away from the substrate;
 wherein a source and a drain of the virtual light emitting control transistor are on a side of the interlayer dielectric layer away from the substrate, and the first planarization layer is on a side of the source and the drain of the virtual light emitting control transistor away from the substrate; and
 the source and the drain of the virtual light emitting control transistor are coupled to the active layer through via holes penetrating through the interlayer dielectric layer, the second gate insulating layer and the first gate insulating layer; or the source and the drain of the virtual light emitting control transistor are both on a surface of the interlayer dielectric layer away from the substrate, so that the source and the drain of the virtual light emitting control transistor are both insulated and spaced apart from the active layer.

In some embodiments, the display motherboard further includes a plurality of second power lines in each display area and the edge area, and an orthographic projection of each of the plurality of second power lines on the substrate intersects with an orthographic projection of the first power line on the substrate;
 an orthographic projection of each first display electrode on the substrate overlaps an orthographic projection of at most one second power line on the substrate; and
 an orthographic projection of each virtual electrode on the substrate overlaps orthographic projections of at least two second power lines on the substrate.

In some embodiments, an orthographic projection of each of the virtual electrodes on the substrate overlaps orthographic projections of 3 to 40 of the second power lines on the substrate.

In some embodiments, the first power lines and the second power lines are disposed in the same layer.

In some embodiments, the virtual electrode has a first boundary and a second boundary adjacent to each other, an extending direction of the first boundary is identical to an extending direction of the first power line, an extending direction of the second boundary intersects with the extending direction of the first boundary, an orthographic projection of the first boundary on the substrate is between orthographic projections of two adjacent first power lines on the substrate, and an orthographic projection of the second boundary on the substrate overlaps an orthographic projection of the second power line on the substrate.

In some embodiments, the second power lines includes a plurality of wiring groups arranged along a second direction, each of the plurality of wiring groups includes a first wiring portion and a second wiring portion, two ends of the first wiring portion are respectively coupled to two adjacent first power lines, the second wiring portion extends along the second direction, and the second wiring portion is coupled to a plurality of first power lines arranged in sequence; in a same wiring group, the first wiring portion and the second wiring portion do not overlap each other in the first direction and in the second direction; and
 an orthographic projection of the second boundary on the substrate overlaps an orthographic projection of the first wiring portion on the substrate.

In some embodiments, the plurality of first display electrodes in the display area are divided into a plurality of duplicate units, each of the plurality of duplicate units includes a first color electrode, a second color electrode pair and a third color electrode arranged sequentially along the second direction, the second color electrode pair includes two second color electrodes arranged along the first direction, the plurality of duplicate units are arranged along the second direction to form a plurality of duplicate unit groups arranged along the first direction, and adjacent duplicate unit groups in the plurality of duplicate unit groups are offset from each other along the second direction; and the plurality of virtual electrodes in the edge area are arranged in an array, a plurality of virtual electrode in each column are arranged along the first direction, and a plurality of virtual electrodes in each row are arranged along the second direction.

In some embodiments, an orthographic projection of each first color electrode on the substrate and an orthographic projection of each second color electrode on the substrate each does not overlap an orthographic projection of any one first power lines on the substrate; and an orthographic projection of each third color electrode on the substrate overlaps an orthographic projection of one first power line on the substrate.

In some embodiments, the orthographic projection of each first color electrode on the substrate and the orthographic projection of each second color electrode on the substrate each does not overlap an orthographic projection of any one second power line on the substrate; and the orthographic projection of each third color electrode on the substrate overlaps an orthographic projection of one second power line on the substrate.

In some embodiments, the edge area has a width between 30 mm and 60 mm.

Embodiments of the present disclosure further provide a method for manufacturing a display motherboard, including:

providing a substrate, the substrate including a valid area and an edge area located on at least one side of the valid area, the valid area including a plurality of panel areas and a to-be-cut area that separates the plurality of panel areas from each other and separates the edge area from a panel area adjacent to the edge area, the panel area including a display area and a frame area surrounding the display area;

forming a plurality of first power lines in each display area and the edge area of the substrate, the first power line extending along a first direction;

forming a plurality of first display electrodes in each display area, and simultaneously forming a plurality of virtual electrodes in the edge area, wherein an orthographic projection of each of the plurality of first display electrodes on the substrate overlaps an orthographic projection of at most one first power line on the substrate, and an orthographic projection of each of the plurality of virtual electrodes on the substrate overlaps orthographic projections of at least two first power lines on the substrate; and cutting the substrate formed with the first power lines, the first display electrodes and the virtual electrodes along the to-be-cut area, to obtain a plurality of display substrates.

In some embodiments, before cutting the substrate formed with the first power lines, the first display electrodes and the virtual electrodes along the to-be-cut area, the method further includes:

forming a pixel defining layer, the pixel defining layer including:

a first pixel defining portion located in the display area and disposed on a side of the plurality of first display electrodes away from the substrate, the first pixel defining portion having a plurality of pixel openings in one-to-one correspondence with the plurality of first display electrodes, and each of the plurality of pixel openings exposing at least a part of the corresponding first display electrode; and a second pixel defining portion located in the edge area and disposed on a side of the plurality of virtual electrodes away from the substrate, the second pixel defining portion covering each of the plurality of virtual electrodes.

In some embodiments, after forming the pixel defining layer, the method further includes:

forming a plurality of light emitting layers disposed in the plurality of pixel openings in one-to-one correspondence; and forming a second electrode layer, wherein the second electrode layer is disposed on a side of the plurality of light emitting layers away from the substrate and located in the display area, and does not overlap with the edge area.

BRIEF DESCRIPTION OF DRAWINGS

The accompanying drawings, as a part of the specification, are used to provide further understanding of the present disclosure, and used to illustrate the present disclosure together with the following specific implementations, rather than limiting the present disclosure, in which:

FIG. 14 is a flowchart of a method for manufacturing a display substrate according to some embodiments of the present disclosure.

DETAIL DESCRIPTION OF EMBODIMENTS

Specific implementations of the present disclosure will be described in detail below in conjunction with the accompanying drawings. It should be understood that, the specific implementations described herein are used for the purpose of illustration and description only, and are not intended to limit the present disclosure.

To make the objectives, technical solutions and advantages of the embodiments of the present disclosure more apparent, the technical solutions of the embodiments of the present disclosure will be described clearly and thoroughly below with reference to the accompanying drawings of the embodiments of the present disclosure. Obviously, the embodiments described herein are only some, but not all, embodiments of the present disclosure. Based on the described embodiments of the present disclosure, all other embodiments obtained by those of ordinary skill in the art without creative efforts fall within the protection scope of the present disclosure.

The terms used here for describing the embodiments of the present disclosure are not intended to limit and/or define the scope of the present disclosure. For example, unless otherwise defined, the technical or scientific terms used in the present disclosure shall have the usual meanings understood by those with ordinary skills in the field to which this disclosure belongs. It should be understood that the words such as "first," "second" and the like used in the present disclosure do not indicate any order, quantity or importance, but are only used to distinguish different components. The singular form word "a," "an," "the" or the like does not mean a quantity limit, but rather means that there is at least one. The word "include," "comprise," or the like means that the element or item appearing before the word covers the element or item listed after the word and their equivalents, but does not exclude other elements or items. The word "connect," "couple" or the like is not restricted to physical or mechanical connections, but may include electrical connections, whether direct or indirect. The word "upper," "lower," "left," "right" or the like is only used to indicate a relative positional relation, and the relative positional relation may change accordingly when the absolute position of the object described changes.

Embodiments of the present disclosure provide a display motherboard, which can be used to manufacture a plurality of display panels. The display motherboard includes a substrate, and the substrate may be any appropriate substrate such as a glass substrate, a quartz substrate, a plastic substrate or the like.

Figure 1:
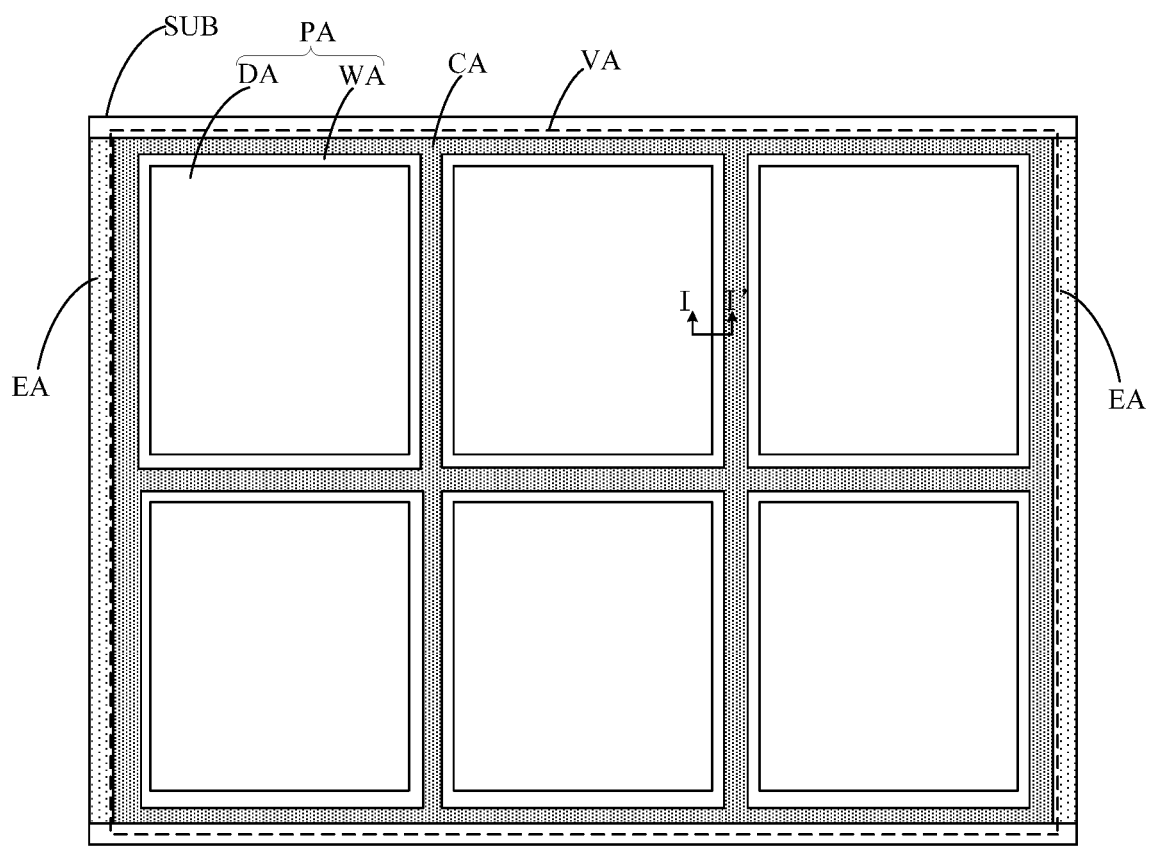
FIG. 1 is a schematic diagram of area divisions of a substrate of a display motherboard according to some embodiments of the present disclosure.

FIG. 1 is a schematic diagram of area divisions of a substrate of a display motherboard according to some embodiments of the present disclosure. As shown in FIG. 1, the substrate SUB includes: a valid area VA and an edge area EA disposed on at least one side of the valid area VA, and the edge area EA corresponds to an edge region of the motherboard. Exemplarily, as shown in FIG. 1, the edge area EA is disposed at both sides of the valid area. In some embodiments, the valid area VA includes: a plurality of panel areas PA and a to-be-cut area CA, the plurality of panel areas PA may be arranged in a matrix, and the to-be-cut area CA separates the plurality of panel areas PA from each other and separates the edge area EA from the panel areas PA adjacent thereto. The panel area PA includes a display area DA and a frame area WA surrounding the display area DA.

Figure 2:
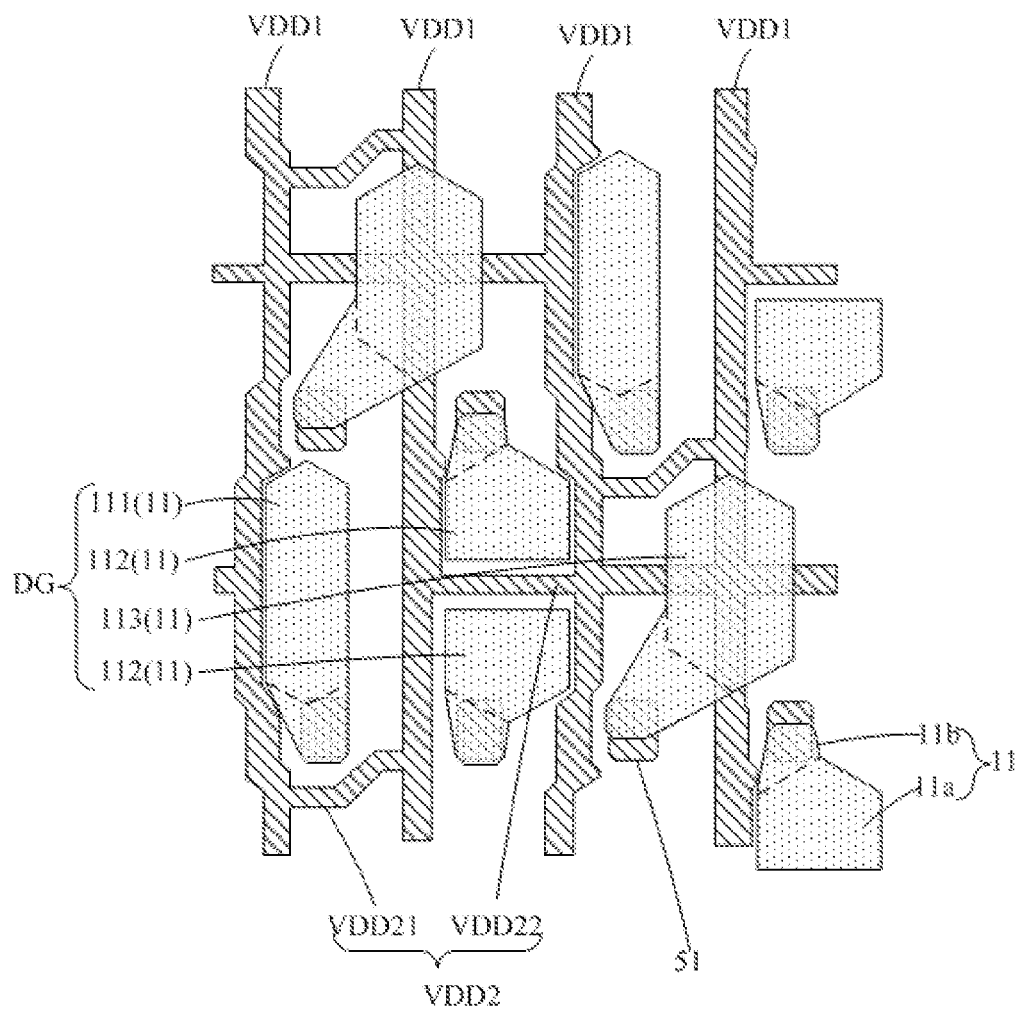
FIG. 2 is a schematic diagram of a part of structures in a display area according to some embodiments of the present disclosure.
Figure 3:
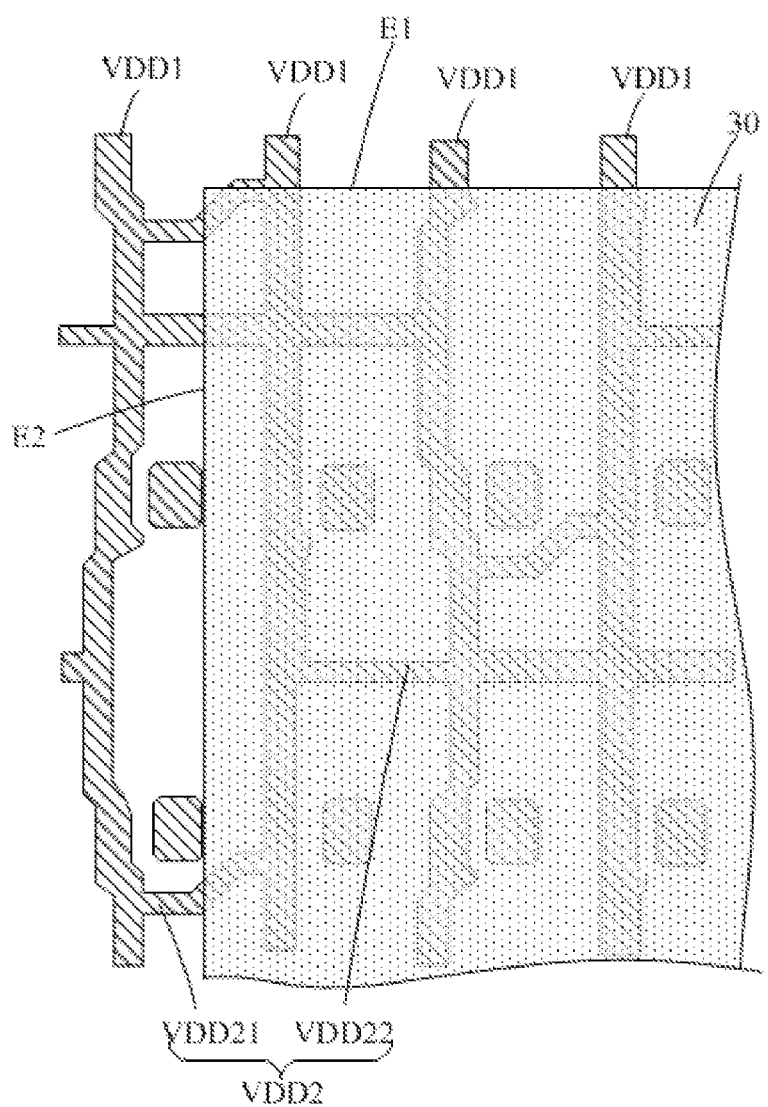
FIG. 3 is a schematic diagram of a part of structures in an edge area according to some embodiments of the present disclosure.

FIG. 2 is a schematic diagram of a part of structures in a display area according to some embodiments of the present disclosure, and FIG. 3 is a schematic diagram of a part of structures in an edge area according to some embodiments of the present disclosure. As shown in FIGS. 2 and 3, the display motherboard further includes: a plurality of first power line VDD1, a plurality of first display electrodes 11 and a plurality of virtual electrodes 30.

The display area DA and the edge area EA are each provided with a plurality of first power lines VDD1 each extending along a first direction. It should be noted here that the first power line VDD1 extending along the first direction means that an overall extending direction of the first power line VDD1 is substantially in the first direction, and it is unnecessary that the first power line VDD1 must be a straight line. In some embodiments, a distance between adjacent first power lines VDD1 in the display area DA is substantially equal to a distance between adjacent first power lines VDD1 in the edge area EA.

Each display area DA is provided therein with a plurality of first display electrodes 11.

A plurality of virtual electrodes 30 are disposed in the edge area EA. The plurality of first display electrodes 11 are disposed in the same layer as the plurality of virtual electrodes 30. In some embodiments, the first display electrodes 11 and the virtual electrodes 30 are disposed on a side, away from the substrate SUB, of a layer where the first power lines VDD1 are located. It should be noted that "in the same layer" in the embodiments of the present disclosure refers to that two structures are formed from a same material by a patterning process, and the two structures therefore are located in the same layer in a stacking relation, which, however, does not mean that the distances of the two structures from the substrate are necessarily the same.

The display motherboard according to the embodiments of the present disclosure is particularly suitable for manufacturing a plurality of Organic Light-Emitting Diode (OLED) display panels. In a process of manufacturing the display motherboard, structures of the display panels, such as pixel structures, encapsulation structures, and the like, may be simultaneously manufactured in the plurality of panel areas PA of the substrate SUB; then, the display motherboard is cut along the to-be-cut area CA, so that different panel areas PA are separated from each other by cutting, and a part of the display motherboard corresponding to a single panel area PA forms a single display panel. In some embodiments, the pixel structure includes a pixel circuit and a light emitting element, the first power line VDD1 is coupled to a power terminal, the power terminal may be a high level power terminal for supplying a high level voltage to the pixel circuit, and the first display electrode 11 is an anode of the light emitting element.

In some embodiments, the first display electrode 11 and the virtual electrode 30 each may be made of a metal, and the metal may include silver.

In some embodiments, it is required to etch a conductive material when manufacturing conductive portions (e.g., a gate, a source and a drain of a transistor, and an anode of a light emitting element). In order to improve the consistency of the etching environment at an edge position and a central position in the display area DA, virtual pixel structures are simultaneously formed in the edge area EA while forming pixel structures in each display area DA, so that the etching effect is more uniform at the edge position and the central position in the display area DA and thus the display uniformity of the display panel is improved.

However, simultaneously manufacturing the pixel structures in the edge area EA may easily lead to defects of dark spots in the display panel that is manufactured subsequently. Specifically, a case where the conductive material for manufacturing the first display electrode 11 and the virtual electrode 30 includes silver is taken as an example, in the process of manufacturing the first display electrode 11 and the virtual electrode 30, a silver film layer is etched using an etching solution, causing the sliver ions mixed in the etching solution. Furthermore, the motherboard is generally provided with metal patterns (e.g., alignment marks and the like, which may be formed from a single-layer or multi-layer metal, such as a Ti—Al—Ti laminated metal), and those metal patterns react with the etching solution to replace the silver ions in the etching solution to generate silver particles. In this case, after the particles are flushed by the etching solution to the display area DA, dark spots are easily generated in the display area DA.

In the embodiments of the present disclosure, as shown in FIGS. 2 and 3, an orthographic projection of each of the plurality of first display electrodes 11 on the substrate SUB overlaps an orthographic projection of at most one first power line VDD1 on the substrate SUB, and an orthographic projection of each of the plurality of virtual electrodes 30 on the substrate SUB overlaps an orthographic projection of at least two first power lines VDD1 on the substrate SUB. Therefore, the area of the virtual electrode 30 in the edge area EA is greater than the area of the first display electrode 11, so that the etched conductive material is reduced when manufacturing the first display electrodes 11 and the virtual electrodes 30, which then decreases the conductive particles in the etching solution, and reduces defects of dark spots of the display panel.

It should be noted that FIG. 2 is a schematic diagram only illustrating a structure of a layer where the first display electrodes and the first power lines are located in a partial region of the display area DA, FIG. 3 is a schematic diagram only illustrating a structure of a layer where the virtual electrode 30 and the first power lines are located in a partial region of the edge area EA, and the two regions shown in FIGS. 2 and 3 are substantially the same in size and shape.

In some embodiments, the edge area EA has a width between 30 mm and 60 mm. The width of the edge area EA refers to a dimension of the edge area EA from the valid area VA towards the edge area. It is to be understood that the shape of the EA in FIG. 1 is depicted only for illustration, and in actual production, the edge area EA is not necessarily rectangular in the strict sense, and the width of the edge area EA may vary at different positions as long as the width at the widest position and the width at the narrowest position are between 30 mm and 60 mm.

In some embodiments, as shown in FIGS. 2 and 3, the display motherboard further includes a plurality of second power lines VDD2 disposed in each display area DA and the edge area EA, and an orthographic projection of each of the plurality of second power lines VDD2 on the substrate SUB intersects with an orthographic projection of a first power lines VDD1 on the substrate SUB. In some embodiments, the first power lines VDD1 and the second power lines VDD2 are disposed in the same layer and form a mesh arrangement, and in this way, the signal line of a power terminal has a small resistance and a low voltage drop, thereby improving stability and uniformity of the power voltage provided by the power terminal.

For example, the orthographic projection of each first display electrode 11 on the substrate SUB overlaps an orthographic projection of at most one second power line VDD2 on the substrate SUB. The orthographic projection of each virtual electrode 30 overlaps orthographic projections of at least two second power lines VDD2.

For example, the orthographic projection of each virtual electrode 30 on the substrate SUB overlaps orthographic projections of 3 to 40 first power lines VDD1 on the substrate SUB, and also overlaps orthographic projections of 3 to 40 second power lines VDD2. Exemplarily, the orthographic projection of each virtual electrode 30 on the substrate SUB overlaps orthographic projections of 8 first power lines VDD1 on the substrate SUB, and overlaps orthographic projections of 6 second power lines VDD2 on the substrate SUB.

In some embodiments, the virtual electrode 30 has a first boundary E1 and a second boundary E2 adjacent to each other. For example, as shown in FIG. 3, the virtual electrode 30 has four boundaries, namely, an upper boundary, a lower boundary, a left boundary and a right boundary, the first boundary E1 is the upper boundary of the virtual electrode 30, and the second boundary E2 is the left boundary of the virtual electrode 30. The first boundary E1 has an extending direction the same as the extending direction of the first power line VDD1, and the second boundary E2 has an extending direction intersecting with the extending direction of the first boundary E1, for example, the second boundary E2 and the first boundary E1 are perpendicular to each other. An orthographic projection of the first boundary E1 on the substrate SUB is located between orthographic projections of two adjacent first power lines VDD1 on the substrate SUB, and the orthographic projection of the second boundary E2 on the substrate SUB overlaps the orthographic projections of the second power lines VDD2 on the substrate SUB.

Figure 4:
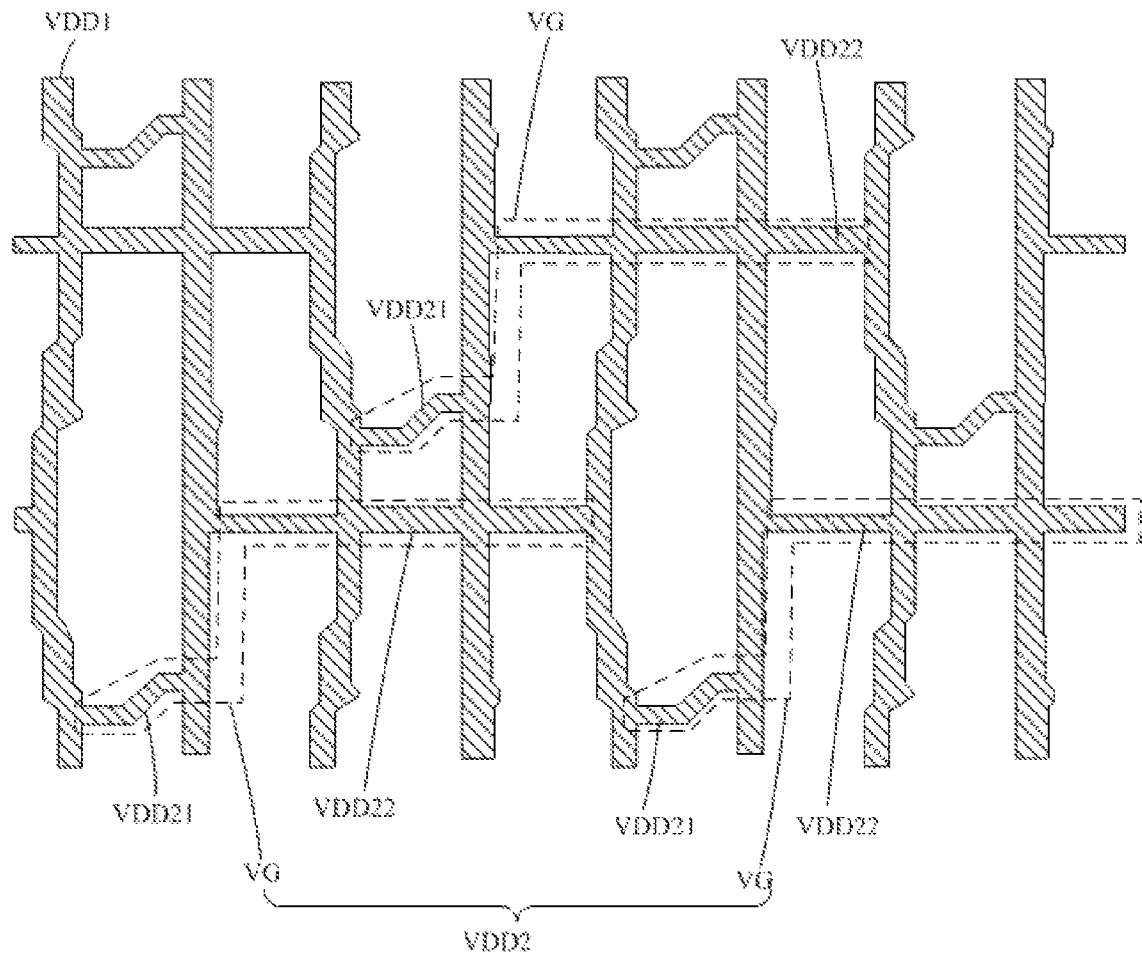
FIG. 4 is a schematic diagram of parts of first power lines and second power lines according to some embodiments of the present disclosure.

FIG. 4 is a schematic diagram of parts of first power lines and second power lines according to some embodiments of the present disclosure. As shown in FIG. 4, the second power line VDD2 includes: a plurality of wiring groups VG arranged along a second direction; each wiring group VG of the plurality of wiring groups VG includes a first wiring portion VDD21 and a second wiring portion VDD22; two ends of the first wiring portion VDD21 are coupled to two adjacent first power lines VDD1, respectively; the second wiring portion VDD22 extends along the second direction and is coupled to a plurality of (e.g., four) first power lines VDD1 that are arranged sequentially. In the same wiring group VG, the first wiring portion VDD21 and the second wiring portion VDD22 do not overlap in the first direction, and do not overlap in the second direction. For example, the second wiring portion VDD22 is a straight line extending along the second direction, and the first wiring portion VDD21 is a broken line.

It is to be noted that shapes and arrangements of the first power line VDD1 and the second power line VDD2 in the edge area EA are the same as those in the display area DA.

For example, the orthographic projection of the first boundary E1 of the virtual electrode 30 on the substrate SUB is located between two adjacent first power lines VDD1 and overlaps the orthographic projection of the first wiring portion VDD21 on the substrate SUB; the orthographic projection of the second boundary E2 of the virtual electrode 30 on the substrate SUB overlaps the orthographic projection of the first wiring portion VDD21 on the substrate SUB.

For example, the orthographic projection of the virtual electrode 30 on the substrate SUB is of a rectangular shape, so as to simplify the manufacturing process. It should be noted that the rectangular shape is only an optional shape of the virtual electrode 30, and in other embodiments, the projection of the virtual electrode 30 on the substrate SUB may be of other shape (e.g., a hexagonal shape), which is not specifically limited here.

For example, the plurality of virtual electrodes 30 in the edge area EA are distributed in an array, a plurality of virtual electrodes 30 in each column are arranged along the first direction, and a plurality of virtual electrodes 30 in each row are arranged along the second direction. The first direction and the second direction intersect with each other, for example, the first direction and the second direction are perpendicular to each other.

In some embodiments, there is an interval between any two virtual electrodes 30, so as to avoid bubbles generated between the virtual electrodes 30 and a film located underneath in the process of manufacturing the first display electrodes 11 and the virtual electrodes 30. In some embodiments, the interval between two adjacent virtual electrodes 30 has a width between 5 μm and 15 μm, for example, a width of 10 μm.

Figure 5:
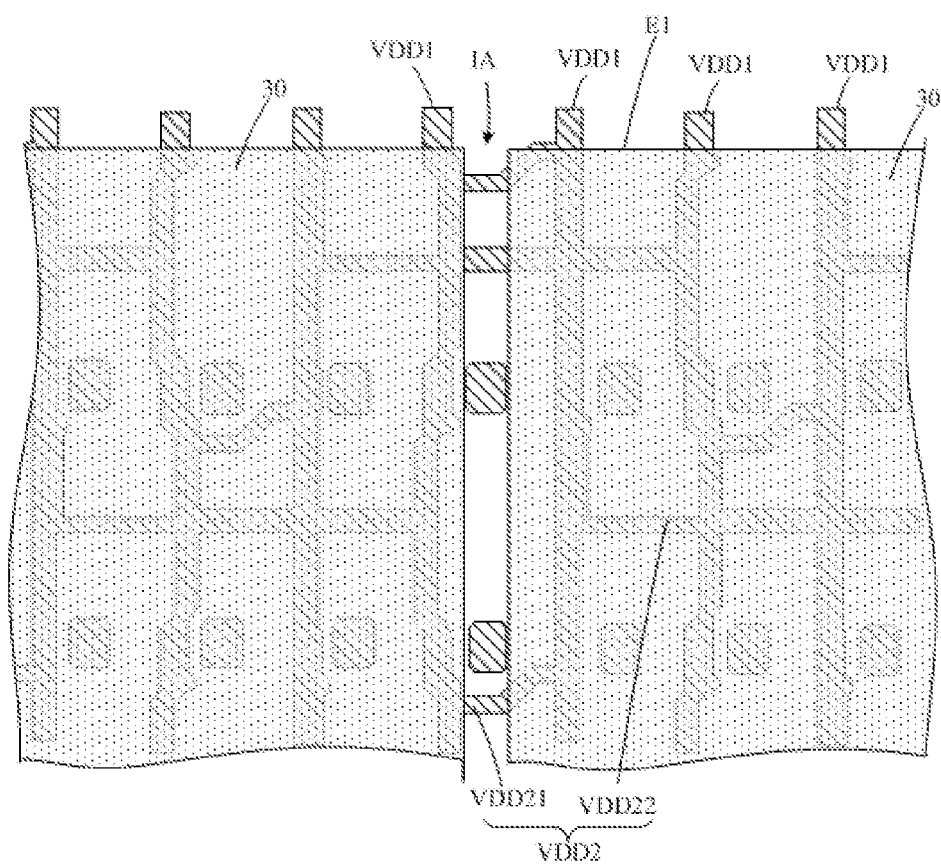
FIG. 5 is a schematic diagram illustrating a positional relation between two virtual electrodes according to some embodiments of the present disclosure.

FIG. 5 is a schematic diagram illustrating a positional relation between two virtual electrodes according to some embodiments of the present disclosure. As shown in FIG. 5, at least two virtual electrodes 30 are arranged along the second direction, an interval area IA between two adjacent virtual electrodes 30 arranged along the second direction is a strip area extending along the first direction, and an orthographic projection of the strip area on the substrate SUB does not overlap the orthographic projection of any one first power line VDD1 on the substrate SUB.

In some embodiments, as shown in FIG. 2, the plurality of first display electrodes 11 in the display area DA are divided into a plurality of duplicate units DG each including one first color electrode 111, one second color electrode pair and one third color electrode 113, and the second color electrode pair includes two second color electrodes 112 arranged along the first direction; the plurality of duplicate units are arranged along the second direction to form a plurality of duplicate unit groups arranged along the first direction, and adjacent duplicate unit groups in the plurality of duplicate unit groups are offset from each other. It should be noted that FIG. 2 only depicts parts of the first power lines VDD1, the second power lines VDD2 and the first display electrodes 11 on the substrate SUB, and the display electrodes, the first power lines VDD1 and the second power lines VDD2 at other positions in the display area DA are arranged in the manner shown in FIG. 2.

It should be further noted that the first color electrode, the second color electrode 112 and the third electrode 113 are electrodes (e.g., anodes) of a first color light emitting element, a second color light emitting element and a third color light emitting element, respectively, which does not mean that the first display electrode 11 itself has a first color, a second color or a third color. For example, the first color electrode 111 is an electrode of a red light emitting element, the second color electrode 112 is an anode of a green light emitting element, and the third color electrode 113 is an anode of a blue light emitting element. It is to be understood that, in the embodiments of the present disclosure, the colors of the light emitting elements corresponding to the first color electrode 111, the second color electrode 112 and the third color electrode 113 are not limited to the foregoing, and may be interchanged.

In some embodiments, as shown in FIG. 2, an orthographic projection of each first color electrode 111 on the substrate SUB and an orthographic projection of each second color electrode 112 on the substrate SUB do not overlap the orthographic projections of the first power lines VDD1 on the substrate SUB. The orthographic projection of each first color electrode 111 on the substrate SUB and the orthographic projection of each second color electrode 112 on the substrate SUB do not overlap the orthographic projections of the second power lines VDD2 on the substrate SUB. For example, in the same duplicate unit group, the orthographic projections of the two second color electrodes 112 are both located between the orthographic projections of two adjacent first power lines VDD1 on the substrate SUB and respectively located on two sides of the second wiring portion of the second power line VDD2. The orthographic projection of the first color electrode on the substrate SUB is located between the orthographic projections of two adjacent first power lines VDD1 on the substrate SUB and located on one side of the second wiring portion VDD22 along the second direction.

An orthographic projection of each third color electrode 113 on the substrate SUB simultaneously overlaps the orthographic projection of one first power line VDD1 on the substrate SUB and the orthographic projection of one second power line VDD2 on the substrate SUB. For example, as shown in FIG. 2, the third color electrode 113 is located at a position where the first power line VDD1 and the second power line VDD2 intersect with each other.

In some embodiments, the display motherboard further includes: a plurality of display pixel circuits located in the display area DA and a plurality of virtual pixel circuits located in the edge area EA. The plurality of display pixel circuits are electrically coupled to the plurality of first display electrodes 111 in one-to-one correspondence. As shown in FIG. 2, the first display electrode 11 includes a main body portion 11a and a connection portion 11b, the connection portion 11b is electrically coupled to the display pixel circuit, and the orthographic projection of the main body portion of the first display electrode 11 on the substrate SUB is of a pentagonal shape or a hexagonal shape. For example, the orthographic projections of the main body portion 11a of the first color electrode 111 and the main body portion 11a of the third color electrode 113 on the substrate SUB are of a hexagonal shape, and the orthographic projection of the main body portion 11a of the second color electrode 112 is of a pentagonal shape.

Figure 6:
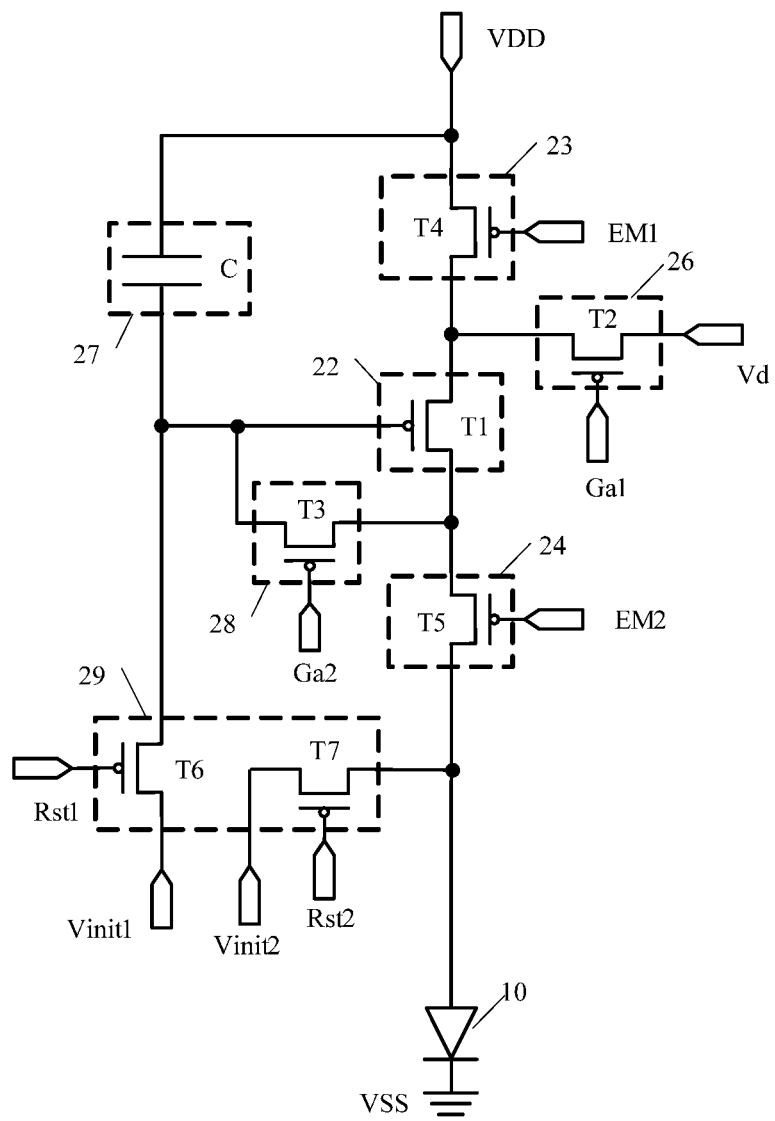
FIG. 6 is a schematic circuit diagram of a light emitting element and a display pixel circuit connected thereto according to some embodiments of the present disclosure.

FIG. 6 is a schematic circuit diagram of a light emitting element and a display pixel circuit connected thereto according to some embodiments of the present disclosure. As shown in FIG. 6, the display pixel circuit includes: a drive sub-circuit 22, a first light emitting control sub-circuit 23, a second light emitting control sub-circuit 24, a data write sub-circuit 26, a storage sub-circuit 27, a threshold compensation sub-circuit 28 and a reset sub-circuit 29. The drive sub-circuit 22 includes a control terminal, a first terminal and a second terminal, and is configured to supply a drive current to the light emitting element 10 to drive the light emitting element 10 to emit light.

For example, the first light emitting control sub-circuit 23 is coupled to a first voltage terminal VDD and the first terminal of the drive sub-circuit 22, respectively, and is configured to control connection and disconnection between the drive sub-circuit 22 and the first voltage terminal VDD. The second light emitting control sub-circuit 24 is electrically coupled to the second terminal of the drive sub-circuit 22 and the first display electrode 11 of the light emitting element 10, and is configured to control connection and disconnection between the drive sub-circuit 22 and the light emitting element 10. The data write sub-circuit 26 is electrically coupled to the first terminal of the drive sub-circuit 22, and is configured to write a data signal into the storage sub-circuit 27 under the control of a scan signal. The storage sub-circuit 27 is electrically coupled to the control terminal of the drive sub-circuit 22 and the first voltage terminal VDD, respectively, and is configured to store the data signal. The threshold compensation sub-circuit 28 is electrically coupled to the control terminal and the second terminal of the drive sub-circuit 22, respectively, and is configured to perform threshold compensation on the drive sub-circuit 22. The reset sub-circuit 29 is electrically coupled to the control terminal of the drive sub-circuit 22 and the first display electrode 11 of the light emitting element 10, and us configured to reset the control terminal of the drive sub-circuit 22 and the first display electrode 11 of the light emitting element 10 under the control of a reset control signal.

For example, as shown in FIG. 6, the drive sub-circuit 22 includes a display drive transistor T1, the control terminal of the drive sub-circuit 22 includes a gate of the drive transistor T1, the first terminal of the drive sub-circuit 22 includes a first electrode of the drive transistor T1, and the second terminal of the drive sub-circuit 22 includes a second electrode of the drive transistor T1. The data write sub-circuit 26 includes a display data write transistor T2, the storage sub-circuit 27 includes a capacitor C1, the threshold compensation sub-circuit 28 includes a display compensation transistor T3, the first light emitting control sub-circuit 23 includes a first display light emitting control transistor T4, the second light emitting control sub-circuit 24 includes a second display light emitting control transistor T5, the reset sub-circuit 29 includes a first display reset transistor T6 and a second display reset transistor T7, and the reset control signal may include a first reset control sub-signal and a second reset control sub-signal.

For example, as shown in FIG. 6, a first electrode of the display data write transistor T2 is electrically coupled to the first electrode of the display drive transistor T1, a second electrode of the display data write transistor T2 is configured to be electrically coupled to a data line Vd to receive a data signal, and a gate of the display data write transistor is configured to be electrically coupled to a first scan signal line Ga1 to receive a scan signal; a first electrode of the capacitor C1 is electrically coupled to the first power terminal VDD, and a second electrode of the capacitor C1 is electrically coupled to the gate of the display drive transistor T1; a first electrode of the display compensation transistor T3 is electrically coupled to the second electrode of the display drive transistor T1, a second electrode of the display compensation transistor T3 is electrically coupled to the gate of the display drive transistor T1, and a gate of the display compensation transistor T3 is configured to be electrically coupled to a second scan signal line Ga2 to receive a compensation control signal; a first electrode of the first display reset transistor T6 is configured to be electrically coupled to a first display reset power terminal Vinit1 to receive a first reset signal, a second electrode of the first display reset transistor T6 is electrically coupled to the gate of the display drive transistor T1, and a gate of the first display reset transistor T6 is configured to be electrically coupled to a first reset control signal line Rst1 to receive the first reset control sub-signal; a first electrode of the second display reset transistor T7 is configured to be electrically coupled to a second reset power terminal Vinit2 to receive a second reset signal, a second electrode of the second display reset transistor T7 is electrically coupled to the first display electrode 11 of the light emitting element 10, and a gate of the second display reset transistor T7 is configured to be electrically coupled to a second reset control signal line Rst2 to receive the second reset control sub-signal; a first electrode of the first display light emitting control transistor T4 is electrically coupled to the first power terminal VDD, a second electrode of the first display light emitting control transistor T4 is electrically coupled to the first electrode of the drive transistor T1, and a gate of the first display light emitting control transistor T4 is configured to be electrically coupled to a first light emitting control signal line EM1 to receive a first light emitting control signal; a first electrode of the second display light emitting control transistor T5 is electrically coupled to the second electrode of the display drive transistor T1, a second electrode of the second display light emitting control transistor T5 is electrically coupled to the second electrode of the light emitting element 10, and a gate of the second display light emitting control transistor T5 is configured to be electrically coupled to a second light emitting control signal line EM2 to receive a second light emitting control signal; the first display electrode 11 of the light emitting element 10 is electrically coupled to the second power terminal VSS. For example, the first power terminal VDD is a high level signal terminal, and the second power terminal VSS is a low level signal terminal. The transistor is coupled to the first power terminal VDD via the mesh structure formed by the first power lines VDD1 and the second power lines VDD2.

It should be noted that, in the embodiments of the present disclosure, in addition to the 7T1C (i.e., seven transistors and one capacitor) structure as shown in FIG. 6, the pixel circuit may have a structure including other number of transistors, for example, a 7T2C structure, a 6T1C structure, a 6T2C structure or a 9T2C structure, which is not limited in the embodiments of the present disclosure.

Figure 7:
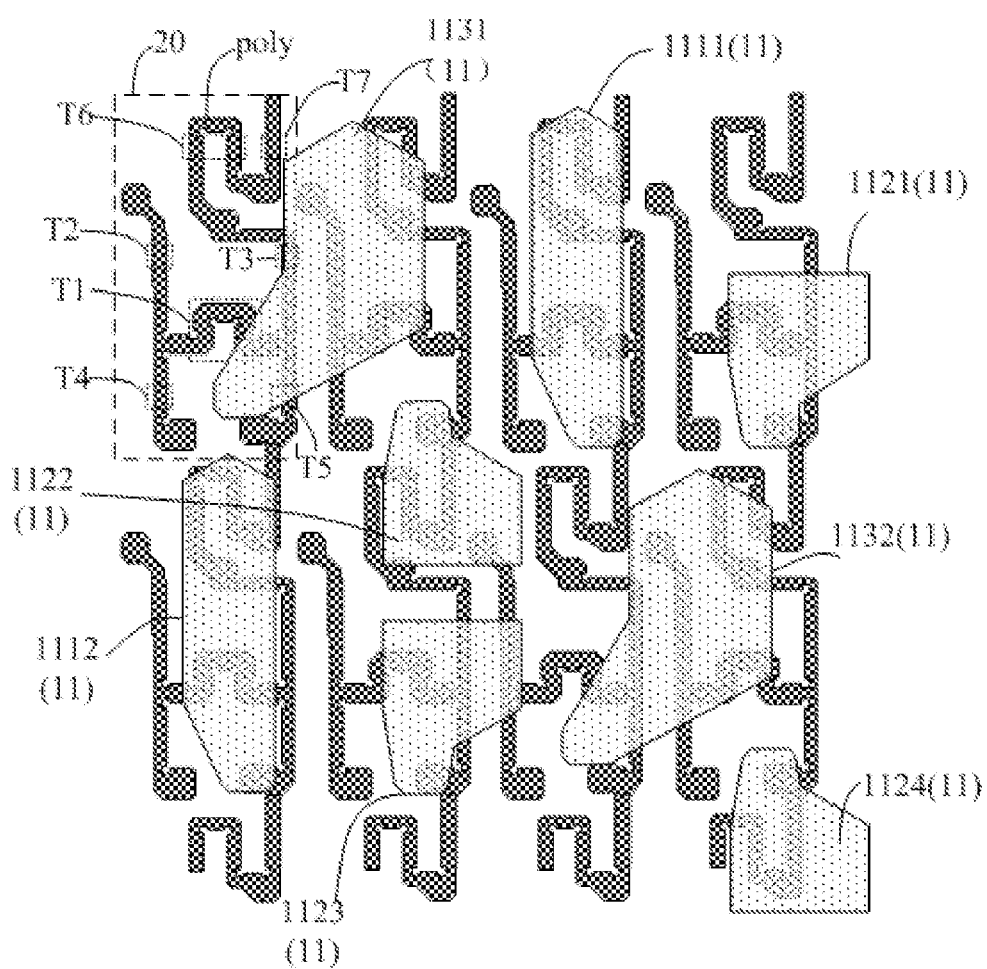
FIG. 7 is a schematic diagram of a part of first display electrodes and semiconductor layers of a part of display pixel circuits according to some embodiments of the present disclosure.

FIG. 7 is a schematic diagram of a part of first display electrodes and semiconductor layers of a part of display pixel circuits according to some embodiments of the present disclosure. The area as shown in FIG. 7 and the area as shown in FIG. 2 are the same area, and different structures are shown. In addition, it should be noted that, in order to clearly show the positional relation between the first display electrode 11 and the display pixel circuit, the position of the semiconductor layer poly in the display pixel circuit represents the position of the display pixel circuit in FIG. 7, and the semiconductor layer poly in the display pixel circuit includes active layers of respective transistors (e.g., transistors T1 to T7 in FIG. 6). The dashed box 20 in FIG. 7 denotes a region where one display pixel circuit is substantially located, and the region where the display pixel circuit is substantially located mainly includes regions where element structures, such as transistors, capacitor(s) and the like, are substantially located.

As shown in FIG. 7, the orthographic projection of the first display electrode 11 on the substrate overlaps the orthographic projections of at most two display pixel circuits on the substrate. For example, FIG. 7 depicts 8 display pixel circuits and 8 first display electrodes including two first color electrodes 1111 and 1112, four second color electrodes 1121 to 1124 and two third color electrodes 1131 and 1132. The third color electrode 1131 is coupled to the display pixel circuit in the first row and the first column in FIG. 7, and covers parts of the semiconductor layers poly of the display pixel circuits respectively in the first row and the first column and the first row and the second column. The first color electrode 1111 is coupled to the display pixel circuit in the first row and the third column, and covers a part of the semiconductor layer poly of the display pixel circuit in the first row and the third column. The second color electrode 1121 is coupled to the display pixel circuit in the first row and the fourth column, and covers a part of the semiconductor layer poly of the display pixel circuit in the first row and the fourth column. The first color electrode 1112 is coupled to the display pixel circuit in the second row and the first column, and covers a part of the semiconductor layer poly of the display pixel circuit in the second row and the first column. The second color electrode 1122 is coupled to the display pixel circuit in the first row and the second column, and covers a part of the semiconductor layer poly of the display pixel circuit in the first row and the second column and a part of the semiconductor layer poly of the display pixel circuit in the second row and the third column. The second color electrode 1123 is coupled to the display pixel circuit in the second row and the second column, and covers a part of the semiconductor layer poly of the display pixel circuit in the second row and the second column and a part of the semiconductor layer poly of the display pixel circuit in the second row and the third column. The third column electrode 1132 is coupled to the display pixel circuit in the second row and the third column, and covers a part of the semiconductor layer poly of the display pixel circuit in the second row and the third column and a part of the semiconductor layer poly of the display pixel circuit in the second row and the fourth column. The second color electrode 1124 is coupled to the display pixel circuit in the second row and the fourth column, and covers a part of the semiconductor layer poly of the display pixel circuit in the second row and the fourth column.

In some embodiments, the display motherboard further includes a plurality of virtual pixel circuits located in the edge area EA, and the orthographic projection of the virtual electrode 30 on the substrate SUB covers orthographic projections of at least two of the plurality of virtual pixel circuits on the substrate SUB. For example, the orthographic projection of the virtual electrode 30 on the substrate SUB covers orthographic projections of 30 to 80 virtual pixel circuits on the substrate SUB.

Figure 8:
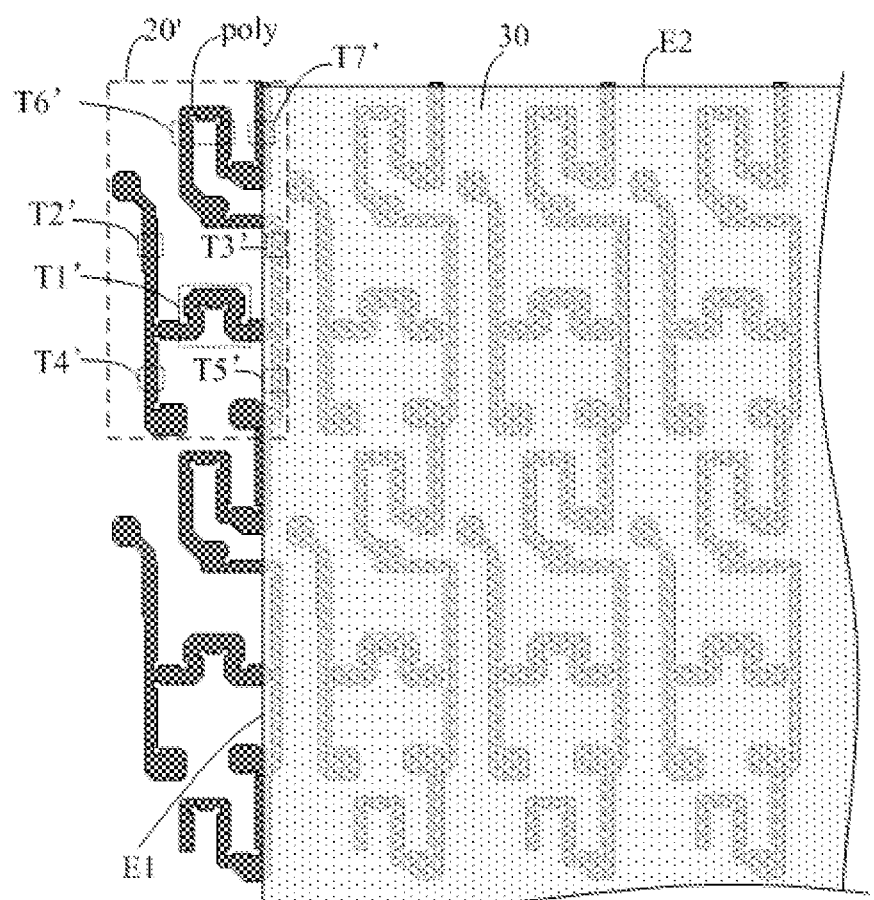
FIG. 8 is a schematic diagram of a semiconductor layer of a virtual pixel circuit and a virtual electrode according to some embodiments of the present disclosure.

For example, the orthographic projections of the virtual pixel circuit and the display pixel circuit on the substrate SUB have substantially the same area. The virtual pixel circuit is also similar to the display pixel circuit in structure. The virtual pixel circuit includes a capacitor and a plurality of virtual transistors. FIG. 8 is a schematic diagram of a semiconductor layer of a virtual pixel circuit and a virtual electrode according to some embodiments of the present disclosure, and the semiconductor layer poly of the virtual pixel circuit includes active layers of respective virtual transistors T1' to T7' in the virtual pixel circuit. The area as shown in FIG. 8 and the area as shown in FIG. 3 are the same area, and different structures are shown. The dashed box 20' in FIG. 8 is a region where one virtual pixel circuit is substantially located, and the region where the virtual pixel circuit is substantially located mainly includes regions where element structures, such as virtual transistors, capacitor(s) and the like, are substantially located. As shown in FIG. 8, the plurality of virtual transistors T1' to T7' are in one-to-one correspondence with the plurality of transistors T1 to T7 in the display pixel circuit. Unlike the display pixel circuit, the transistors T1' to T7' in the virtual pixel circuit may not be coupled to the first power terminal VDD. Moreover, for each of the virtual transistors T1' to T7' in the virtual pixel circuit, the source and drain thereof may be coupled to, or may not be coupled to, the corresponding active layer.

In some embodiments, as shown in FIG. 8, the orthographic projection of the first boundary E1 of the virtual electrode 30 on the substrate overlaps orthographic projections of the semiconductor layers poly of at least two virtual pixel circuits on the substrate. For example, the plurality of virtual transistors include a virtual reset transistor T7', and the orthographic projection of the first boundary E1 on the substrate overlaps orthographic projections of active layers of the virtual reset transistors T7' in at least two virtual pixel circuits on the substrate.

In some embodiments, the orthographic projection of the second boundary E2 of the virtual electrode does not overlap an orthographic projection of any one virtual transistor on the substrate.

It is to be understood that, when the virtual electrode 30 is of a rectangular shape, the first boundary E1 and the second boundary E2 are only two boundaries of the virtual electrode 30, and whether the other two boundaries of the virtual electrode 30 overlap the active layer of a virtual transistor is not specifically limited here. For example, the third boundary opposite to the first boundary E1 may overlap the semiconductor layers of at least two virtual pixel circuits, and the fourth boundary opposite to the second boundary E2 may overlap the semiconductor layers of a plurality of virtual transistors, or may not overlap the semiconductor layer of any one virtual transistor.

Figure 9:
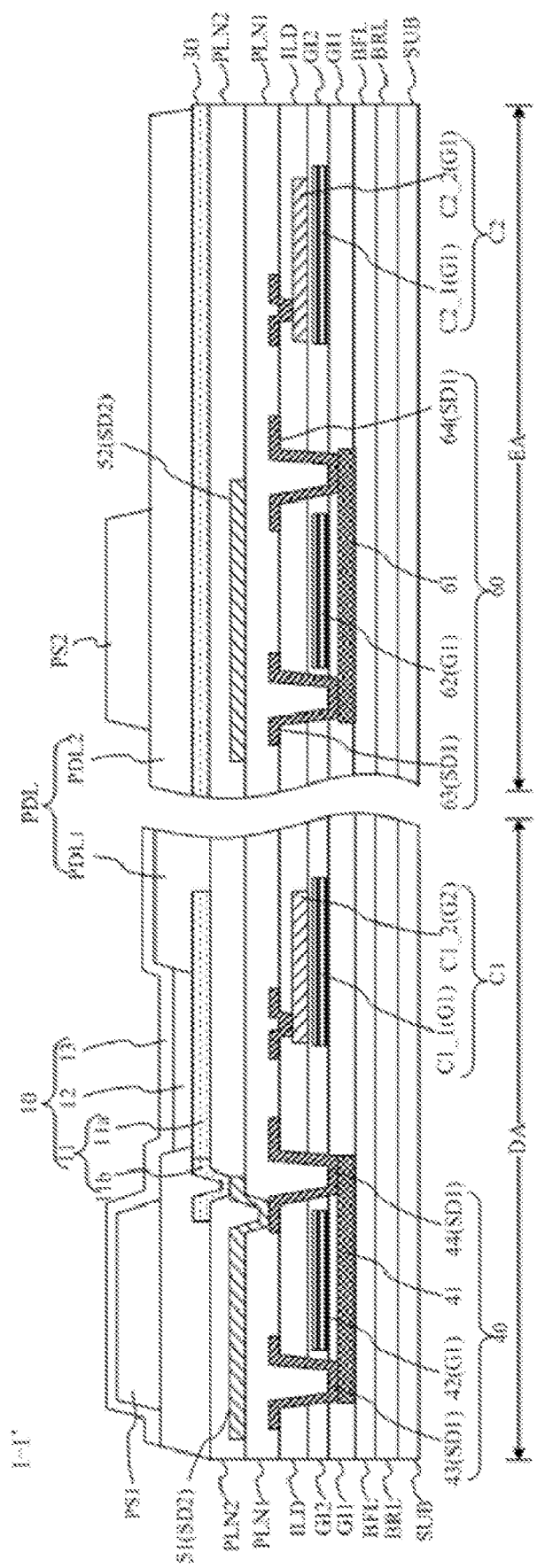
FIG. 9 is a cross-sectional view taken along a line I-I' in FIG. 1 according to some embodiments of the present disclosure.

FIG. 9 is a cross-sectional view taken along a line I-I' in FIG. 1 according to some embodiments of the present disclosure, and FIG. 1 only exemplarily illustrate one first display electrode 11 and a part of structures thereunder as well as parts of a virtual electrode 30 and structures thereunder.

For example, a barrier layer BRL is disposed on the substrate, and at least covers the edge area EA and the display area DA, and optionally, the barrier layer BRL may further cover a part of the to-be-cut area CA. The barrier layer BRL is configured to block moisture and/or oxygen from penetrating through the substrate SUB. The barrier layer BR may include an inorganic material such as silicon oxide (SiOx), silicon nitride (SiNx), and/or silicon oxynitride (SiON), and may be formed to have a multi-layer or a single-layer structure. In addition, in a case where the substrate SUB has a relatively uneven surface, the barrier layer BRL can improve the flatness of the surface of the substrate SUB.

For example, a buffer layer BFL is disposed on the barrier layer BRL, and at least covers the edge area EA and the display area DA. The buffer layer BFL can prevent or reduce diffusion of metal atoms and/or impurities from the substrate SUB into the semiconductor layer. For example, the buffer layer BFL may include an inorganic material such as silicon oxide, silicon nitride, and/or silicon oxynitride, and may be formed to have a multi-layer or a single-layer structure.

For example, the semiconductor layer is disposed on a side of the buffer layer BFL away from the substrate SUB, and includes active layers 41 of respective transistors 40 in the display pixel circuit and active layers 61 of respective virtual transistors 60 in the virtual pixel circuit. The active layer 61 may include a channel region disposed in a stack manner with a gate, and a source region and a drain region respectively disposed at two sides of the channel region. The source region and the drain region may include an impurity having a higher concentration than that of an impurity of the channel region. The impurity may be an N-type impurity or a P-type impurity.

For example, a first gate insulating layer G11 is disposed on a side of the semiconductor layer away from the substrate SUB, so as to separate the active layer 61 from the gate 62 of every transistor 60 in the virtual pixel circuit, and separate the active layer 41 from the gate 42 of every transistor 40 in the display pixel circuit. The gate of each transistor in the display pixel circuit and the virtual pixel circuit is located on the side of the active layer away from the substrate SUB.

For example, a first gate metal layer G1 is disposed on a side of the first gate insulating layer GI1 away from the substrate SUB, and includes: the gate 42 of every transistor 40 and a first electrode plate C1_1 of a capacitor C1 in the display pixel circuit, and the gate 62 of every transistor 60 and a first electrode plate C2_1 of a capacitor in the virtual pixel circuit.

For example, a second gate insulating layer GI2 is disposed on a side of the first gate metal layer G1 away from the substrate SUB, and may cover the gate of every transistor and the first electrode plate of every capacitor.

For example, a second gate metal layer G2 is disposed on the second gate insulating layer GI2, and includes: a second electrode layer C1_2 of the capacitor C1 in the display pixel circuit and a second electrode plate C2_2 of the capacitor C2 in the virtual pixel circuit.

For example, an interlayer dielectric layer ILD is disposed on a side of the second gate metal layer G2 away from the substrate SUB, and covers the second electrode plate C1_2 of the capacitor C1 and the second electrode plate C2_2 of the capacitor C2.

For example, a first source-drain metal layer SD1 is disposed on a side of the interlayer dielectric layer ILD away from the substrate SUB, and includes: a source 43 and a drain 44 of every transistor 40 in the display pixel circuit, and a source 63 and a drain 64 of every virtual transistor in the virtual pixel circuit.

The transistor 40 shown in FIG. 8 is the second display light emitting control transistor T5 in the display pixel circuit. The transistor 60 shown in FIG. 8 is the virtual transistor T5' in the virtual pixel circuit corresponding to the second display light emitting control transistor, that is, the position of the virtual transistor T5' in the virtual pixel circuit is identical to the position of the second display light emitting control transistor T5 in the display pixel circuit.

The source 43 and the drain 44 of each transistor 44 in the display pixel circuit are coupled to the active layer 41 through via holes. By taking the second display light emitting control transistor as an example, the source of the display light emitting control transistor is coupled to the active layer through a via hole penetrating through the interlayer dielectric layer ILD, the second gate insulating layer GI2 and the first gate insulating layer GI1, and the drain of the display light emitting control transistor is coupled to the active layer through a via hole penetrating through the interlayer dielectric layer ILD and the second gate insulating layer GI2 and the first gate insulating layer GI1.

In some embodiments, the source 63 and the drain 64 of each virtual transistor 60 in the virtual pixel circuit are coupled to the active layer through via holes. By taking the virtual light emitting control transistor as an example, the source of the virtual light emitting control transistor is coupled to the active layer through a via hole penetrating through the interlayer dielectric layer ILD, the second gate insulating layer GI2 and the first gate insulating layer GI1, and the drain of the virtual light emitting control transistor is coupled to the active layer through a via hole penetrating through the interlayer dielectric layer ILD, the second gate insulating layer GI2 and the first gate insulating layer GI1.

Figure 10:
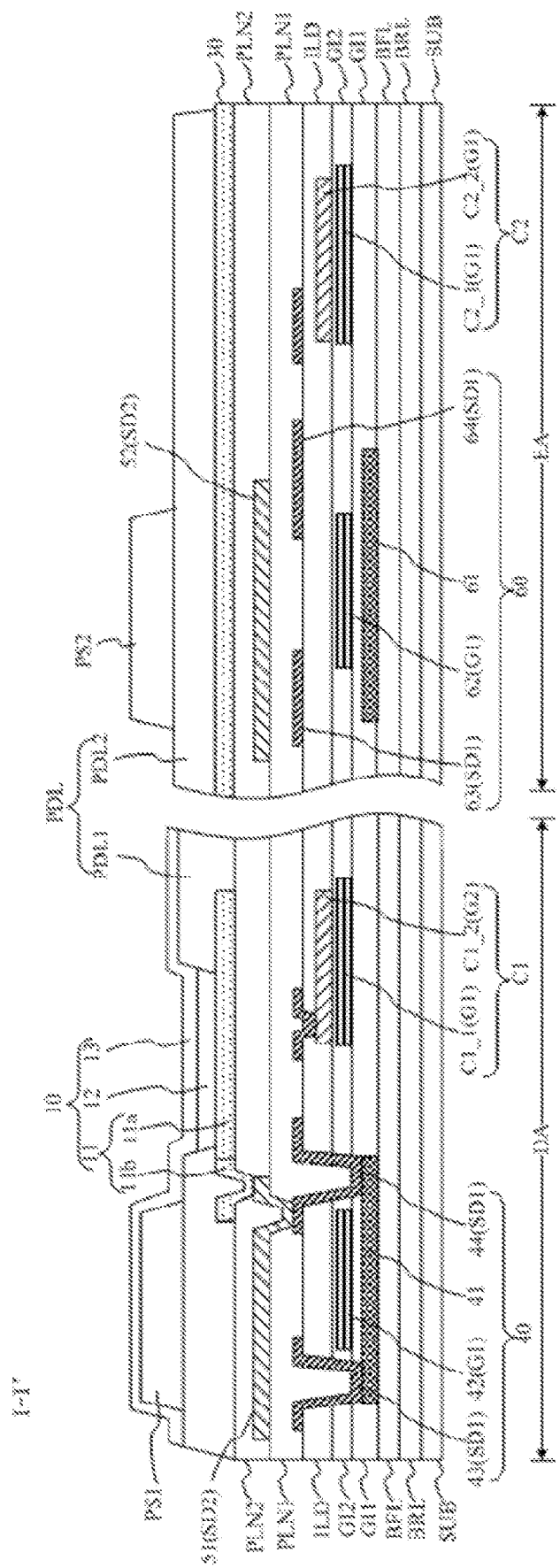
FIG. 10 is a cross-sectional view taken along a line I-I' in FIG. 1 according to some other embodiments of the present disclosure.

FIG. 10 is a cross-sectional view taken along a line I-I' in FIG. 1 according to some other embodiments of the present disclosure. As shown in FIG. 10, in some other embodiments, the interlayer dielectric layer ILD in the edge area EA is provided with no via hole, so that the source 63 and the drain 64 of every virtual transistor 60 in the virtual pixel circuit are insulated and spaced apart from the active layer 61. By taking the virtual light emitting control transistor as an example, the source and the drain of the virtual light emitting control transistor are disposed on a surface of the interlayer dielectric layer ILD away from the substrate SUB, so that the source and the drain of the virtual light emitting control transistor are insulated and spaced apart from the active layer.

For example, the display motherboard further includes a first planarization layer PLN1 located in the display area DA and the edge area EA, and the first planarization layer PLN1 is disposed on a side of the display pixel circuit and the virtual pixel circuit away from the substrate SUB.

For example, a second source-drain metal layer SD2 is disposed on a side of the first planarization layer PLN1 away from the substrate SUB, and includes: a plurality of display connectors 51 located in the display area DA, and a plurality of virtual connectors 52 located in the edge area EA and disposed between the virtual pixel circuit and the virtual electrode 30. In addition, both the first power lines VDD1 and the second power lines VDD2 are located in the second source-drain metal layer SD2. The display connectors 51 are coupled to the first display electrodes 11 in one-to-one correspondence, and the virtual connectors 52 are in one-to-one correspondence with the virtual pixel circuits but may not be coupled to the virtual pixel circuits. In some embodiments, the positional relation between the orthographic projection of the virtual connector 52 on the substrate SUB and the orthographic projection of the virtual pixel circuit on the substrate SUB may refer to the positional relation between the orthographic projection of the display connector 51 on the substrate SUB and the orthographic projection of the display pixel circuit on the substrate SUB.

For example, the display connector 51 in the display area DA is coupled to the drain of the display light emitting control transistor through a via hole in the first planarization layer PLN1, and the virtual connector 52 in the edge area EA is disposed on a surface of the first planarization layer PLN1. That is, the first planarization layer PLN1 in the edge area EA may not be provided with a via hole, so that the virtual connector 51 is insulated and spaced apart from the drain of the virtual light emitting control transistor.

For example, the display motherboard further includes a second planarization layer PLN2 located in the display area DA and the edge area EA and on a side of the first planarization layer PLN1 away from the substrate SUB, and a surface of the second planarization layer PLN2 away from the substrate SUB is substantially flat. As shown in FIGS. 2 and 9, the main body portion 11a of the first display electrode 11 is disposed on the surface of the second planarization layer PLN2 away from the substrate, and the connection portion 11b of the first display electrode 11 is coupled to a corresponding display connector 51 through a via hole in the second planarization layer PLN2. The virtual electrode 30 is disposed on the surface of the second planarization layer PLN2 away from the substrate SUB, that is, a portion of the second planarization layer PLN2 corresponding to the virtual electrode 30 is not provided with a via hole, so that the virtual electrode 30 is insulated and spaced apart from the second source-drain metal layer SD2.

For example, the display motherboard further includes: a pixel defining layer PDL including a first pixel defining portion PDL1 located in the display area DA and a second pixel defining portion PDL2 located in the edge area EA. The first pixel defining portion PDL1 is disposed on a side of the first display electrode 11 away from the substrate SUB, and includes a plurality of pixel openings in one-to-one correspondence with the plurality of first display electrodes 11 and each of the plurality of pixel openings exposes at least a part of the corresponding first display electrode 11. The second pixel defining portion PDL2 is disposed on a side of the virtual electrode 30 away from the substrate SUB, and is provided with no pixel opening, so as to entirely cover every virtual electrode 30. For example, the pixel defining layer PDL may be formed from an organic insulating material such as polyimide, polyphthalamide, polyphthalamide, acrylic resin, benzocyclobutene, phenolic resin or the like.

For example, the display motherboard further includes: a plurality of light emitting layers 13 and a second display electrode layer 12 located in the display area DA. The plurality of light emitting layers 13 are disposed in the plurality of pixel openings in one-to-one correspondence. The light emitting layer 13 may include a small molecule organic material or a polymer molecule organic material, may be a fluorescent light emitting material or a phosphorescent light emitting material, and may emit red light, green light or blue light, or may emit white light. The second display electrode layer 12 is disposed on a side of the plurality of light emitting layers 13 away from the substrate SUB. A part of the second display electrode layer 12 on each light emitting layer acts as a cathode of the light emitting element. It should be understood that the second display electrode layer 12 and the light emitting layers 13 are both located in the display area DA, and both the to-be-cut area CA and the edge area EA may not be provided with the second display electrode layer 12 and the light emitting layers 13.

For example, the display motherboard may further include: a spacer layer. The spacer layer include a first spacer PS1 located in the display area DA and a second spacer PS2 located in the edge area EA, the first spacer PS1 is disposed on a side of the first pixel defining portion PDL1 away from the substrate SUB, and the second spacer PS2 is disposed on a side of the second pixel defining portion PDL2 away from the substrate SUB. The material of the spacer layer may be the same as the material of the pixel defining layer PDL.

Figure 11:
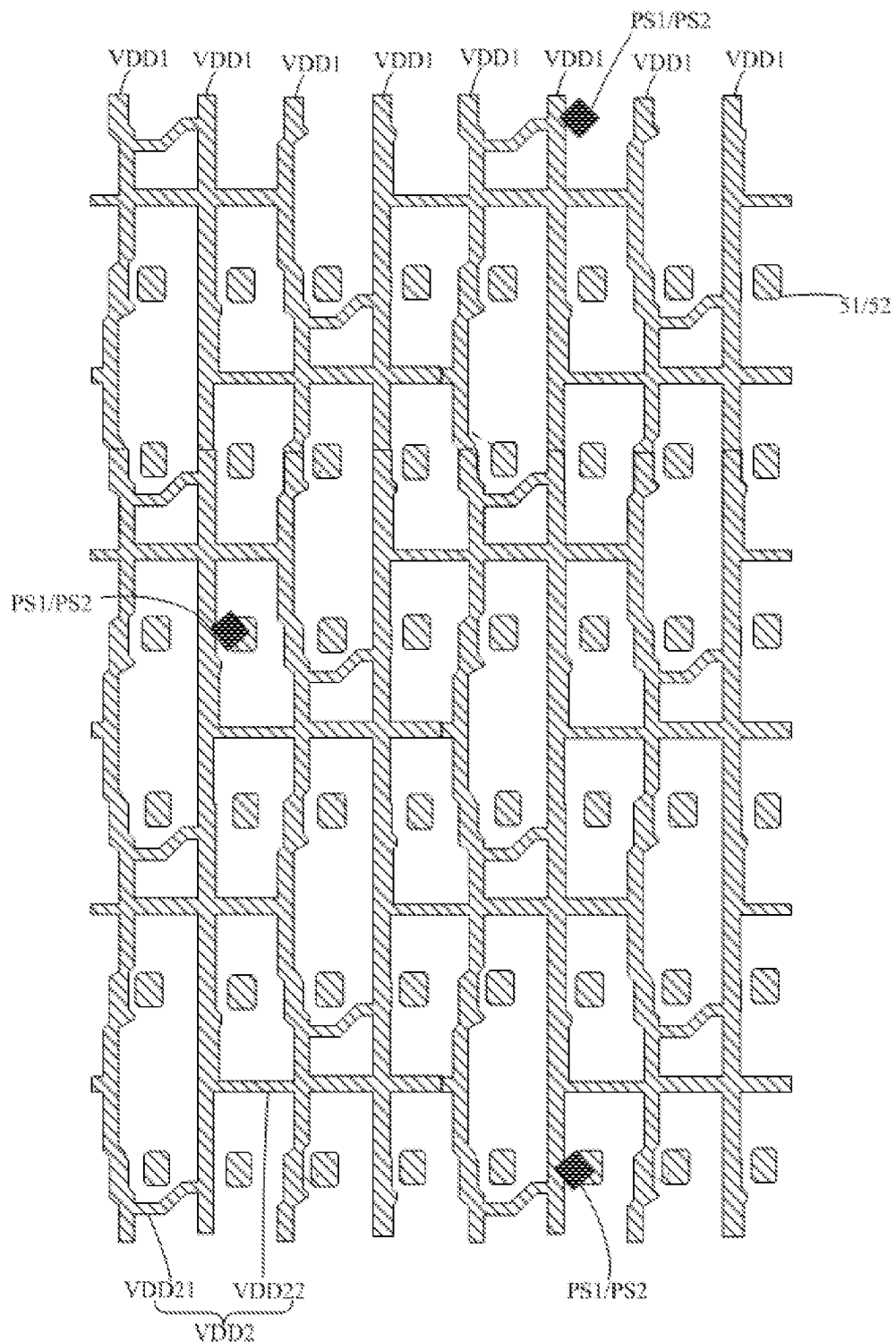
FIG. 11 is a schematic diagram illustrating a positional relation between a first spacer/second spacer and a first power line and a second power line according to some embodiments of the present disclosure.

FIG. 11 is a schematic diagram illustrating a positional relation between first and second spacers and first and second power lines according to some embodiments of the present disclosure. As shown in FIG. 11, the first spacers PS1 in the display area DA are arranged in the same manner as the second spacers PS2 in the edge area EA, that is, both the first spacers PS1 and the second spacers PS2 are arranged in a plurality of rows. Moreover, an interval between two adjacent first spacers PS1 in a same row may be identical to an interval between two adjacent second spacers PS2 in a same row. FIG. 11 only shows three first/second spacers PS1/PS2 respectively in three rows. An orthographic projection of each first spacer PS1 on the substrate overlaps an orthographic projection of one first power line VDD1 on the substrate, and an orthographic projection of each second spacer PS2 on the substrate overlaps an orthographic projection of one second power line VDD2 on the substrate.

Figure 12:
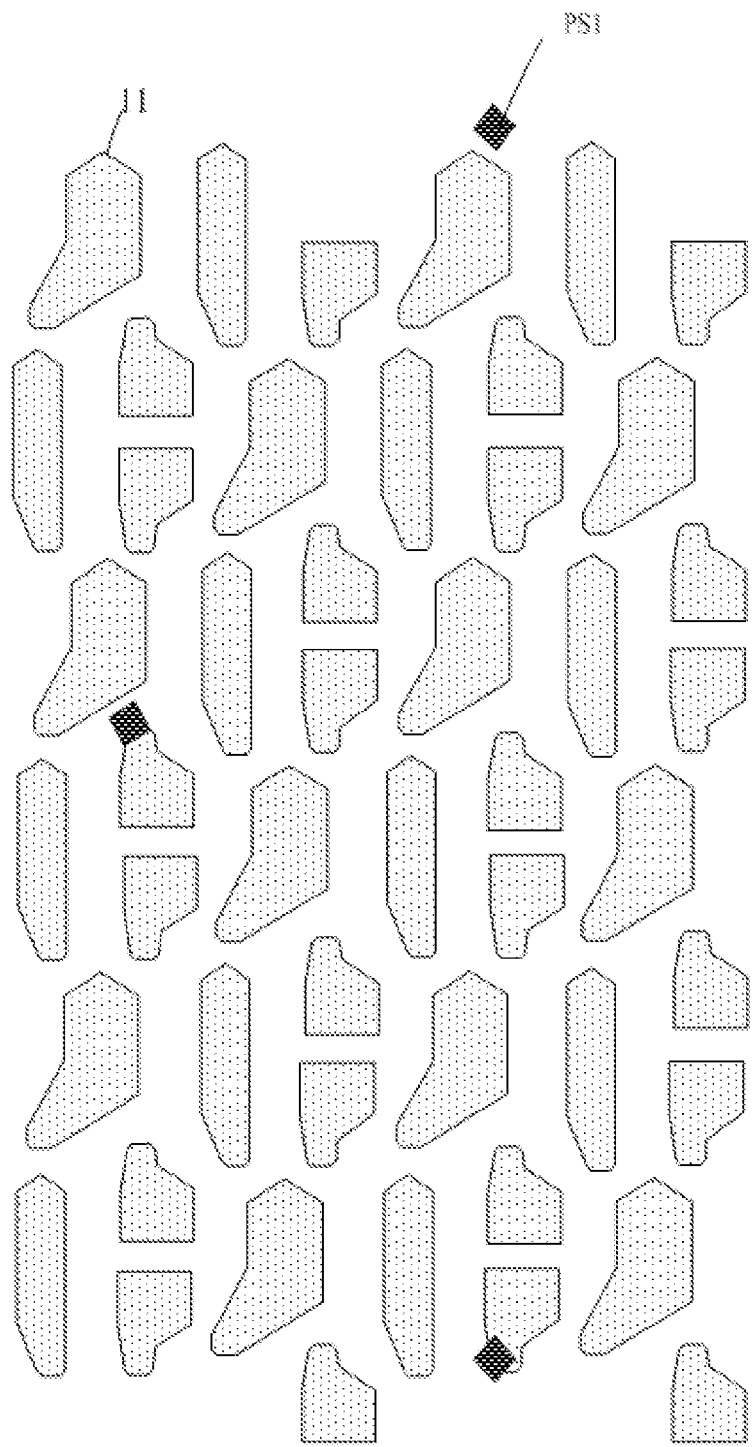
FIG. 12 is a schematic diagram illustrating a positional relation between a first spacer and a first display electrode according to some embodiments of the present disclosure.
Figure 13:
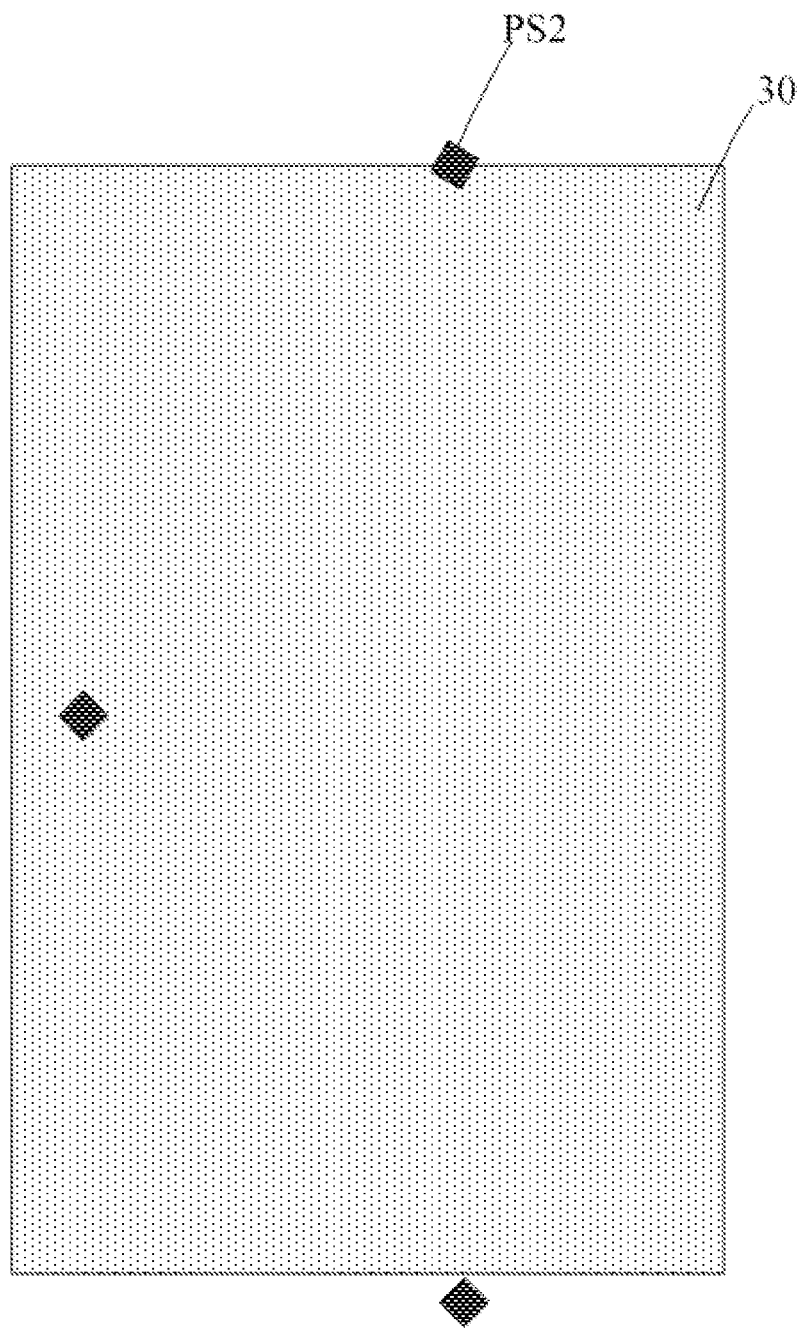
FIG. 13 is a schematic diagram illustrating a positional relation between a second spacer and a virtual electrode according to some embodiments of the present disclosure.

FIG. 12 is a schematic diagram illustrating a positional relation between a first spacer and a first display electrode according to some embodiments of the present disclosure, and FIG. 13 is a schematic diagram illustrating a positional relation between a second spacer and a virtual electrode according to some embodiments of the present disclosure. As shown in FIG. 12, the orthographic projection of the first display electrode 11 on the substrate overlaps the orthographic projection of at most one first spacer PS1 on the substrate. The orthographic projection of the virtual electrode 30 on the substrate overlaps the orthographic projections, on the substrate, of two second spacers PS2 respectively in two rows.

For example, the display motherboard further includes: an encapsulation layer (not shown) located in the panel area PA and disposed on a side of the second display electrode 12 away from the substrate SUB.

The substrate SUB according to embodiments of the present disclosure is provided thereon with the first gate insulating layer GI1, the second gate insulating layer GI2, the barrier layer BRL and the buffer layer BFL. However, it is to be understood that, in some embodiments, each of these layers may be omitted or added as actually required, which is not specifically limited in the present disclosure.

According to embodiments of the present disclosure, there is provided a method for manufacturing a display substrate, the display substrate is obtained by cutting the display motherboard in the above embodiments. FIG. 14 is a flowchart of a method for manufacturing a display substrate according to some embodiments of the present disclosure. As shown in FIG. 14, the manufacturing method includes steps S1 to S4.

S1 includes: providing a substrate SUB. As shown in FIG. 1, the substrate SUB includes: a valid area VA and an edge area EA located on at least one side of the valid area VA, and the valid area VA includes a plurality of panel areas PA that may be arranged in a matrix, and an to-be-cut area CA that separates the plurality of panel areas PA from each other and separates the edge area EA from panel areas PA adjacent thereto. Each panel area PA includes a display area DA and a frame area WA surrounding the display area DA.

S2 includes: forming a plurality of first power lines VDD1 in each of the display areas DA and the edge area EA of the substrate SUB, and each first power line VDD1 extends along the first direction, as shown in FIG. 2.

S3 includes: forming a plurality of first display electrodes 11 in each display area DA, and simultaneously forming a plurality of virtual electrodes 30 in the edge area EA. Referring to FIGS. 1 to 3, an orthographic projection of each of the plurality of first display electrodes 11 on the substrate SUB overlaps the orthographic projection of at most one first power line VDD1 on the substrate SUB, and an orthographic projection of each of the plurality of virtual electrodes 30 on the substrate SUB overlaps the orthographic projections of at least two first power lines VDD1 on the substrate.

S4 includes: cutting the substrate SUB formed with the first power lines VDD1, the first display electrodes 11 and the virtual electrodes 30 along the to-be-cut area CA to obtain a plurality of display substrates.

In some embodiments, when forming the first power lines VDD1, second power lines may be formed simultaneously. The positional relation between the second power lines and the first display electrodes 11 and the virtual electrodes 30 may refer to the above description, and is not repeatedly described here.

In some embodiments, before forming the first display electrodes 11 and the virtual electrodes 30, display pixel circuits and virtual pixel circuits may be formed. Structures of the display pixel circuit and the virtual pixel electrode, the positional relation between the display pixel circuit and the first display electrode, and the positional relation between the virtual pixel circuit and the virtual electrode have been describe above, and not repeatedly described here.

In some embodiments, between S3 and S4, the method may include:

forming a pixel defining layer, the pixel defining layer including a first pixel defining portion located in the display area and a second pixel defining portion located in the edge area, the first pixel defining portion being disposed on a side of the first display electrodes away from the substrate and having a plurality of pixel opening in one-to-one correspondence with the plurality of first display electrodes, and each pixel opening exposing at least a portion of the corresponding first display electrode; the second pixel defining portion being disposed on a side of the virtual electrodes away from the substrate, and covering every virtual electrode.

In some embodiments, after forming the pixel defining layer, the method further includes:

forming a plurality of light emitting layers that are disposed in the plurality of pixel openings in one-to-one correspondence.

Then the method further includes forming a second electrode layer, the second electrode layer being disposed on a side of the plurality of light emitting layers away from the substrate and located in the display area, and not overlapping with the edge area.

The structures of the pixel defining layer, the light emitting layers and the second electrode layer may refer to the above description, and are not repeatedly described here.

It could be understood that the above implementations are merely exemplary implementations employed for illustrating the principle of the present disclosure, and the present disclosure is not limited thereto. Those with ordinary skill in the art may make various variations and improvements without departing from the spirit and essence of the present disclosure, and these variations and improvements are also considered as falling into the protection scope of the present disclosure.

What is claimed is:

1. A display motherboard, comprising:
a substrate, the substrate comprising a valid area and an edge area on at least one side of the valid area, the valid area comprising a plurality of panel areas and a to-be-cut area, the to-be-cut area separating the plurality of panel areas from each other and separating the edge area from a panel area adjacent to the edge area, and the panel area comprising a display area and a frame area surrounding the display area;
a plurality of first power lines on the substrate, each display area and the edge area being provided with a plurality of the first power lines, and the first power line extending along a first direction; and
a plurality of first display electrodes in each display area and a plurality of virtual electrodes in the edge area, the plurality of first display electrodes and the plurality of virtual electrodes being in the same layer,
wherein an orthographic projection of each of the plurality of first display electrodes on the substrate overlaps an orthographic projection of at most one first power line, and an orthographic projection of each of the plurality of virtual electrodes on the substrate overlaps orthographic projections of at least two first power lines on the substrate.

2. The display motherboard of claim 1, wherein the orthographic projection of each of the plurality of virtual electrodes on the substrate overlaps orthographic projections of 3 to 40 first power lines on the substrate.

3. The display motherboard of claim 1, wherein the orthographic projection of each of the plurality of virtual electrodes on the substrate is of a rectangular shape.

4. The display motherboard of claim 1, wherein there is an interval between any two virtual electrodes, and an interval between two adjacent virtual electrodes has a width between 5 μm and 15 μm, and an interval area between at least two adjacent virtual electrodes is a strip area extending along the first direction, and an orthographic projection of the strip area on the substrate does not overlap an orthographic projection of any one first power line on the substrate.

5. The display motherboard of claim 1, further comprising a pixel defining layer, the pixel defining layer comprising:
a first pixel defining portion in the display area and on a side of the plurality of first display electrodes away from the substrate, the first pixel defining portion having a plurality of pixel openings in one-to-one correspondence with the plurality of first display electrodes, and each of the plurality of pixel openings exposing at least a part of the corresponding first display electrode; and
a second pixel defining portion in the edge area and on a side of the plurality of virtual electrodes away from the substrate, the second pixel defining portion covering each of the plurality of virtual electrodes.

6. The display motherboard of claim 5, further comprising:
a plurality of light emitting layers in the plurality of pixel openings in one-to-one correspondence; and
a second electrode layer in the display area and on a side of the plurality of light emitting layers away from the substrate.

7. The display motherboard of claim 5, further comprising:
a spacer layer comprising first spacers in the display area and second spacers in the edge area, the first spacers being on a side of the first pixel defining portion away from the substrate, and the second spacers being on a side of the second pixel defining portion away from the substrate, wherein an orthographic projection of each of the first spacers on the substrate overlaps an orthographic projection of one first power line on the substrate;
the first spacers in the display area are arranged in a plurality of rows, and an orthographic projection of the first display electrode on the substrate overlaps an orthographic projection of at most one of the first spacers on the substrate; and
the second spacers in the edge area are arranged in a plurality of rows, and an orthographic projection of the virtual electrode on the substrate overlaps orthographic projections of two of the second spacers respectively in two rows on the substrate.

8. The display motherboard of claim 1, further comprising a plurality of display pixel circuits in the display area, the plurality of display pixel circuits being electrically coupled to the plurality of first display electrodes in one-to-one correspondence,
wherein the first display electrode comprises a main body portion and a connection portion, the connection portion is electrically coupled to the corresponding display pixel circuit, and an orthographical projection of the main body portion on the substrate is of a pentagonal shape or a hexagonal shape.

9. The display motherboard of claim 8, wherein an orthographic projection of each of the plurality of first display electrodes on the substrate overlaps orthographic projections of at most two of the plurality of display pixel circuits on the substrate.

10. The display motherboard of claim 8, wherein the display pixel circuit comprises a display light emitting control transistor, and the display motherboard further comprises:
   a first planarization layer in both the display area and the edge area and on a side of the display light emitting control transistor away from the substrate;
   a second planarization layer in both the display area and the edge area and on a side of the first planarization layer away from the substrate;
   display connectors coupled to the plurality of first display electrodes in one-to-one correspondence, the display connectors being between the first planarization layer and the second planarization layer, the main body portion of the first display electrode being on a surface of the second planarization layer away from the substrate, the connection portion of the first display electrode being coupled to the corresponding display connector through a via hole in the second planarization layer, and the display connector being coupled to a drain of the display light emitting control transistor through a via hole in the first planarization layer; and
   a plurality of virtual pixel circuits in the edge area and between the substrate and the first planarization layer, an orthographic projection of the virtual electrode on the substrate covering orthographic projections of at least two of the plurality of virtual pixel circuits on the substrate;
   wherein the plurality of virtual electrodes are on the surface of the second planarization layer away from the substrate.

11. The display motherboard of claim 10, wherein each of the plurality of virtual pixel circuits comprises a plurality of virtual transistors comprising a virtual reset transistor, each of the plurality of virtual transistors comprising an active layer,
   wherein the virtual electrode has a first boundary extending along the first direction, and an orthographic projection of the first boundary on the substrate overlaps orthographic projections of the active layers of the virtual reset transistors in at least two of the plurality of virtual pixel circuits on the substrate, and
   the virtual electrode further has a second boundary adjacent to the first boundary, an extending direction of the second boundary intersects with an extending direction of the first boundary, and an orthographic projection of the second boundary on the substrate does not overlap an orthographic projection of any one virtual transistor on the substrate.

12. The display motherboard of claim 10, wherein each of the plurality of virtual pixel circuits comprises a virtual light emitting control transistor, and the display motherboard further comprises:
   a plurality of virtual connectors in the edge area and between the plurality of virtual pixel circuits and the plurality of virtual electrodes, the plurality of virtual connectors being on a surface of the first planarization layer away from the substrate;
   a first gate insulating layer between an active layer and a gate of the virtual light emitting control transistor, the gate of the virtual light emitting control transistor being on a side of the active layer away from the substrate;
   a second gate insulating layer on a side of the gate of the virtual light emitting control transistor away from the substrate; and
   an interlayer dielectric layer on a side of the second gate insulating layer away from the substrate;
   wherein a source and a drain of the virtual light emitting control transistor are on a side of the interlayer dielectric layer away from the substrate, and the first planarization layer is on a side of the source and the drain of the virtual light emitting control transistor away from the substrate; and
   wherein the source and the drain of the virtual light emitting control transistor are coupled to the active layer through via holes penetrating through the interlayer dielectric layer, the second gate insulating layer and the first gate insulating layer; or the source and the drain of the virtual light emitting control transistor are both on a surface of the interlayer dielectric layer away from the substrate, so that the source and the drain of the virtual light emitting control transistor are both insulated and spaced apart from the active layer.

13. The display motherboard of claim 1, further comprising a plurality of second power lines in the display area and the edge area, wherein an orthographic projection of each of the plurality of second power lines on the substrate intersects with an orthographic projection of the first power line on the substrate;
   an orthographic projection of each of the plurality of first display electrodes on the substrate overlaps an orthographic projection of at most one second power line on the substrate; and
   an orthographic projection of each of the plurality of virtual electrodes on the substrate overlaps orthographic projections of at least two second power lines on the substrate,
   wherein the first power lines and the second power lines are in the same layer.

14. The display motherboard of claim 13, wherein the orthographic projection of each of the plurality of virtual electrodes on the substrate overlaps orthographic projections of 3 to 40 second power lines on the substrate.

15. The display motherboard of claim 13, wherein the virtual electrode has a first boundary and a second boundary adjacent to each other, an extending direction of the first boundary is identical to an extending direction of the first power line, an extending direction of the second boundary intersects with the extending direction of the first boundary, an orthographic projection of the first boundary on the substrate is between orthographic projections of two adjacent first power lines on the substrate, and an orthographic projection of the second boundary on the substrate overlaps an orthographic projection of the second power line on the substrate.

16. The display motherboard of claim 13, wherein the second power lines comprises a plurality of wiring groups arranged in a second direction, each of the plurality of wiring groups comprises a first wiring portion and a second wiring portion, two ends of the first wiring portion are respectively coupled to two adjacent first power lines, the second wiring portion extends along the second direction, and the second wiring portion is coupled to a plurality of first power lines arranged sequentially; in a same wiring group, the first wiring portion and the second wiring portion do not overlap each other in the first direction and in the second direction; and an orthographic projection of the second boundary on the substrate overlaps an orthographic projection of the first wiring portion on the substrate.

17. The display motherboard of claim 13, wherein the plurality of display electrodes in the display area are divided into a plurality of duplicate units, each of the plurality of duplicate units comprises a first color electrode, a second color electrode pair and a third color electrode arranged sequentially along the second direction, the second color electrode pair comprises two second color electrodes arranged along the first direction, the plurality of duplicate units are arranged along the second direction to form a plurality of duplicate unit groups arranged along the first direction, and adjacent duplicate unit groups in the plurality of duplicate unit groups are offset from each other along the second direction; and the plurality of virtual electrodes in the edge area are arranged in an array, a plurality of virtual electrode in each column are arranged along the first direction, and a plurality of virtual electrodes in each row are arranged along the second direction.

18. The display motherboard of claim 17, wherein an orthographic projection of each first color electrode on the substrate and an orthographic projection of each second color electrode on the substrate each does not overlap an orthographic projection of any one first power line on the substrate;

an orthographic projection of each third color electrode on the substrate overlaps an orthographic projection of one first power line on the substrate;

the orthographic projection of each first color electrode on the substrate and an orthographic projection of each second color electrode on the substrate each does not overlap an orthographic projection of any one second power line on the substrate; and the orthographic projection of each third color electrode on the substrate overlaps an orthographic projection of one second power line on the substrate.

19. A method for manufacturing a display substrate, comprising:

providing a substrate, wherein the substrate comprises a valid area and an edge area located on at least one side of the valid area, the valid area comprises a plurality of panel areas and a to-be-cut area that separates the plurality of panel areas from each other and separates the edge area from a panel area adjacent to the edge area, and the panel area comprises a display area and a frame area surrounding the display area;

forming a plurality of first power lines in each display area and the edge area of the substrate, the first power line extending along a first direction;

forming a plurality of first display electrodes in each display area, and simultaneously forming a plurality of virtual electrodes in the edge area, wherein an orthographic projection of each of the plurality of first display electrodes on the substrate overlaps an orthographic projection of at most one first power line on the substrate, and an orthographic projection of each of the plurality of virtual electrodes on the substrate overlaps orthographic projections of at least two first power lines on the substrate; and cutting the substrate formed with the first power lines, the first display electrodes and the virtual electrodes along the to-be-cut area, to obtain a plurality of display substrates.

20. The method of claim 19, before cutting the substrate formed with the first power lines, the first display electrodes and the virtual electrodes along the to-be-cut area, further comprising:

forming a pixel defining layer, the pixel defining layer comprising:

a first pixel defining portion located in the display area and disposed on a side of the plurality of first display electrodes away from the substrate, wherein the first pixel defining portion has a plurality of pixel openings in one-to-one correspondence with the plurality of first display electrodes, and each of the plurality of pixel openings exposes at least a part of the corresponding first display electrode; and a second pixel defining portion located in the edge area and disposed on a side of the plurality of virtual electrodes away from the substrate, the second pixel defining portion covering each of the plurality of virtual electrodes, and after forming the pixel defining layer, the method further comprising:

forming a plurality of light emitting layers disposed in the plurality of pixel openings in one-to-one correspondence; and forming a second electrode layer, wherein the second electrode layer is disposed on a side of the plurality of light emitting layers away from the substrate and located in the display area, and does not overlap with the edge area.

\* \* \* \* \*